(12) United States Patent
Kawashima et al.

(10) Patent No.: US 11,694,594 B2
(45) Date of Patent: Jul. 4, 2023

(54) DISPLAY DEVICE, DRIVING METHOD OF DISPLAY DEVICE, AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Koji Kusunoki, Kanagawa (JP); Kei Takahashi, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/976,919

(22) Filed: Oct. 31, 2022

(65) Prior Publication Data

US 2023/0055169 A1 Feb. 23, 2023

Related U.S. Application Data

(63) Continuation of application No. 16/756,343, filed as application No. PCT/IB2018/058462 on Oct. 30, 2018, now Pat. No. 11,488,528.

(30) Foreign Application Priority Data

Nov. 9, 2017 (JP) .................................. 2017-216322
Nov. 30, 2017 (JP) .................................. 2017-230410

(Continued)

(51) Int. Cl.
G09G 3/20 (2006.01)
H01L 27/12 (2006.01)
(Continued)

(52) U.S. Cl.
CPC ............. *G09G 3/2007* (2013.01); *G09G 3/20* (2013.01); *G09G 3/2074* (2013.01);
(Continued)

(58) Field of Classification Search
CPC ...... G09G 3/2007; G09G 3/20; G09G 3/2074; G09G 3/3233; G09G 2300/0417;
(Continued)

(56) References Cited

U.S. PATENT DOCUMENTS 6,806,857 B2 10/2004 Sempel et al.
6,909,242 B2 6/2005 Kimura
(Continued)

FOREIGN PATENT DOCUMENTS

CN 001409289 A 4/2003
CN 001421842 A 6/2003
(Continued)

OTHER PUBLICATIONS

International Search Report (Application No. PCT/IB2018/058462) dated Jan. 29, 2019.
(Continued)

*Primary Examiner* — Darlene M Ritchie
(74) *Attorney, Agent, or Firm* — Fish & Richardson P.C.

(57) ABSTRACT

To provide a display device capable of displaying a plurality of images by superimposition using a plurality of memory circuits provided in a pixel. A plurality of memory circuits are provided in a pixel, and signals corresponding to images for superimposition are retained in each of the plurality of memory circuits. In the pixel, the signals corresponding to the images for superimposition are added to each of the plurality of memory circuits. The signals are added to the signals retained in the memory circuits by capacitive coupling. A display element can display an image corresponding to a signal in which a signal written to a pixel through a
(Continued)

wiring is added to the signals retained in the plurality of memory circuits. Reduction in the amount of arithmetic processing for displaying images by superimposition can be achieved.

4 Claims, 22 Drawing Sheets

(30) Foreign Application Priority Data

| Feb. 22, 2018 | (JP) | ................................ 2018-029712 |
| Feb. 22, 2018 | (JP) | ................................ 2018-029714 |
| Jun. 6, 2018 | (JP) | ................................ 2018-108252 |

(51) Int. Cl.
    *H01L 29/786* (2006.01)
    *G09G 3/3233* (2016.01)
    *H04N 23/50* (2023.01)
    *H10B 99/00* (2023.01)

(52) U.S. Cl.
    CPC ....... *G09G 3/3233* (2013.01); *H01L 27/1225* (2013.01); *H01L 27/1255* (2013.01); *H01L 29/7869* (2013.01); *G09G 2300/0417* (2013.01); *G09G 2300/0852* (2013.01); *G09G 2300/0861* (2013.01); *G09G 2320/0295* (2013.01); *G09G 2340/0428* (2013.01); *H01L 27/124* (2013.01); *H01L 27/1207* (2013.01); *H01L 29/78648* (2013.01); *H04N 23/50* (2023.01); *H10B 99/00* (2023.02)

(58) Field of Classification Search
    CPC ... G09G 2300/0852; G09G 2300/0861; G09G 2320/0295; G09G 2340/0428; H01L 27/1225; H01L 27/1255; H01L 27/1207; H01L 27/124; H01L 29/7869; H01L 29/78648; H04N 23/50; H10B 99/00
    See application file for complete search history.

(56) References Cited

U.S. PATENT DOCUMENTS

| 7,151,511 | B2 | 12/2006 | Koyama |
| 7,250,927 | B2 | 7/2007 | Yamazaki et al. |
| 7,274,363 | B2 | 9/2007 | Ishizuka et al. |
| 7,554,362 | B2 | 6/2009 | Kimura |
| 7,583,032 | B2 | 9/2009 | Kimura |
| 7,602,385 | B2 | 10/2009 | Kurokawa et al. |
| 7,724,217 | B2 | 5/2010 | Koyama |
| 7,859,488 | B2 | 12/2010 | Kimura |
| 7,859,493 | B2 | 12/2010 | Sempel et al. |
| 7,911,233 | B2 | 3/2011 | Kimura |
| 7,915,830 | B2 | 3/2011 | Kimura |
| 7,928,945 | B2 | 4/2011 | Kimura et al. |
| 8,067,775 | B2 | 11/2011 | Miyairi et al. |
| 8,368,427 | B2 | 2/2013 | Kimura |
| 8,378,578 | B2 | 2/2013 | Kimura |
| 8,384,631 | B2 | 2/2013 | Sempel et al. |
| 8,570,456 | B2 | 10/2013 | Kimura |
| 8,604,704 | B2 | 12/2013 | Kimura |
| 8,643,591 | B2 | 2/2014 | Kimura et al. |
| 8,723,550 | B2 | 5/2014 | Kimura |
| 9,029,851 | B2 | 5/2015 | Miyairi et al. |
| 9,047,815 | B2 | 6/2015 | Kimura |
| 9,111,893 | B2 | 8/2015 | Ebisuno et al. |
| 9,318,512 | B2 | 4/2016 | Miyairi et al. |
| 9,552,775 | B2 | 1/2017 | Koyama |
| 9,601,603 | B2 | 3/2017 | Miyairi et al. |
| 10,140,940 | B2 | 11/2018 | Aoki |
| 10,153,380 | B2 | 12/2018 | Miyairi et al. |
| 10,170,632 | B2 | 1/2019 | Miyairi et al. |
| 10,763,372 | B2 | 9/2020 | Miyairi et al. |
| 10,930,787 | B2 | 2/2021 | Kimura |
| 2003/0098875 | A1 | 5/2003 | Kurokawa et al. |
| 2004/0263440 | A1 | 12/2004 | Kimura et al. |
| 2008/0024399 | A1 | 1/2008 | Yamazaki et al. |
| 2010/0289830 | A1 | 11/2010 | Yamamoto et al. |
| 2013/0076801 | A1 | 3/2013 | Yoshinaga |
| 2014/0292823 | A1 | 10/2014 | Lee et al. |
| 2014/0327664 | A1 | 11/2014 | Kanda et al. |
| 2015/0144945 | A1 | 5/2015 | Kusunoki et al. |
| 2015/0280005 | A1 | 10/2015 | Kimura |
| 2017/0025080 | A1 | 1/2017 | Aoki |
| 2021/0050453 | A1 | 2/2021 | Miyairi et al. |
| 2021/0167219 | A1 | 6/2021 | Kimura |

FOREIGN PATENT DOCUMENTS

| CN | 001734544 A | 2/2006 |
| CN | 001912980 A | 2/2007 |
| CN | 102197490 A | 9/2011 |
| CN | 106409228 A | 2/2017 |
| EP | 1182636 A | 2/2002 |
| EP | 1296310 A | 3/2003 |
| EP | 1610292 A | 12/2005 |
| EP | 2290642 A | 3/2011 |
| JP | 2002-123218 A | 4/2002 |
| JP | 2002-140034 A | 5/2002 |
| JP | 2003-248469 A | 9/2003 |
| JP | 2003-316318 A | 11/2003 |
| JP | 2004-341314 A | 12/2004 |
| JP | 2006-524835 | 11/2006 |
| JP | 2012-145655 A | 8/2012 |
| JP | 2017-027012 A | 2/2017 |
| KR | 2003-0044858 A | 6/2003 |
| TW | 200301452 | 7/2003 |
| WO | WO-2001/091095 | 11/2001 |
| WO | WO-2003/058594 | 7/2003 |
| WO | WO-2004/097781 | 11/2004 |
| WO | WO-2010/047217 | 4/2010 |
| WO | WO-2013/171938 | 11/2013 |

OTHER PUBLICATIONS

Written Opinion (Application No. PCT/IB2018/058462) dated Jan. 29, 2019.

Chinese Office Action (Application No. 201880068976.9) dated Jan. 11, 2022.

$Q1=C1(Vref-Vw1)$
$Q2=C2(Vref-Vw2)$
$Q3=C3(Vref-V0)$ $Q1'=C1(Vg-Vdata1)$
$Q2'=C2(Vg-Vdata2)$
$Q3'=C3(Vg-V0)$

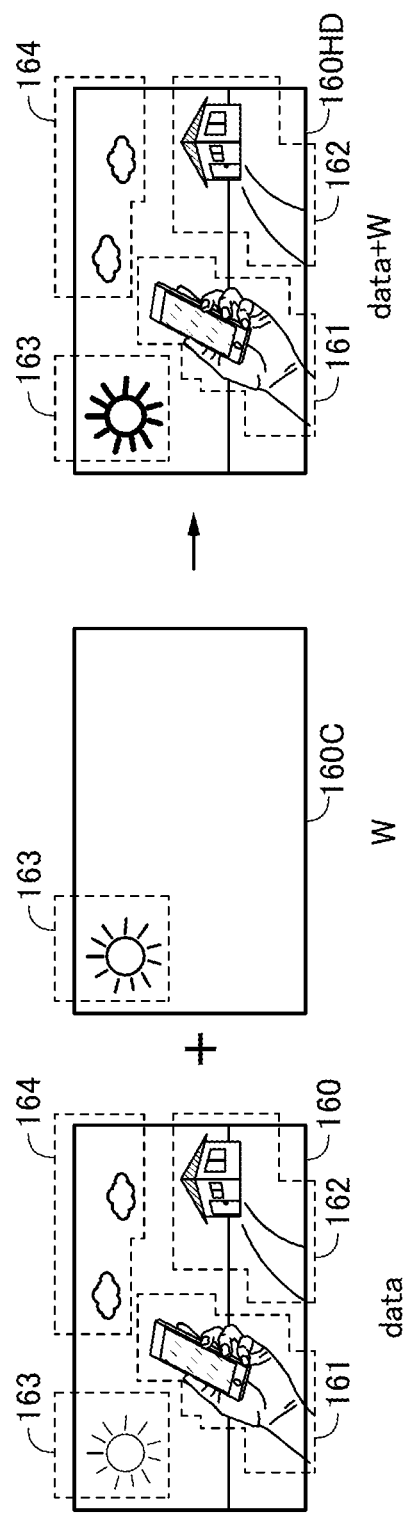

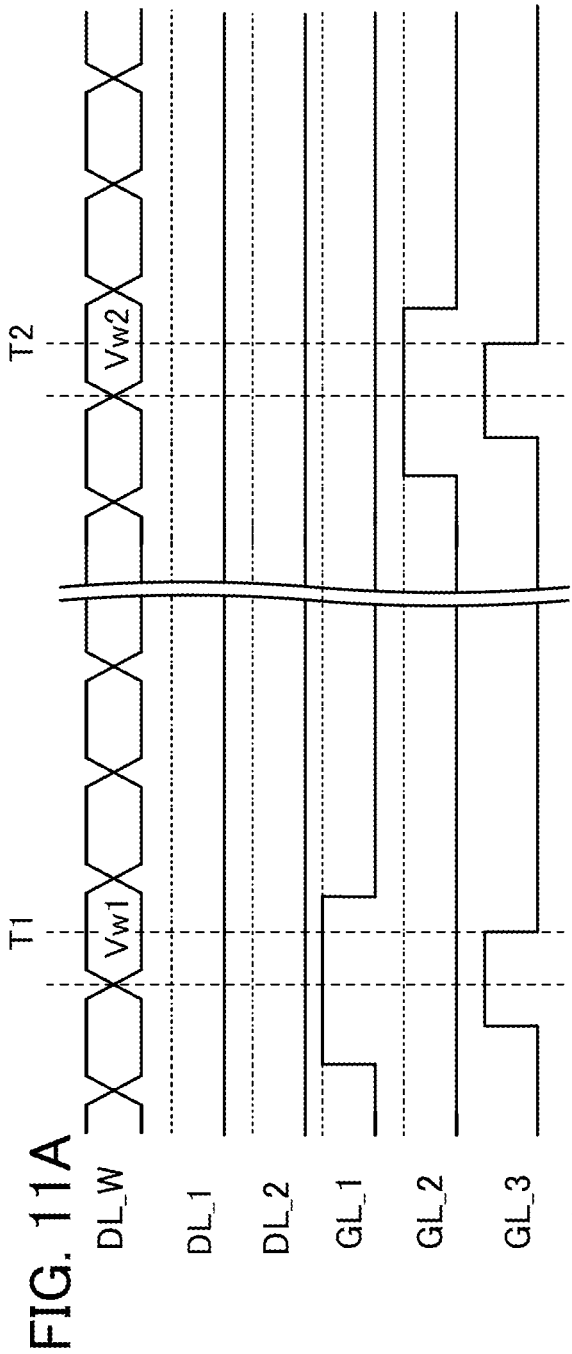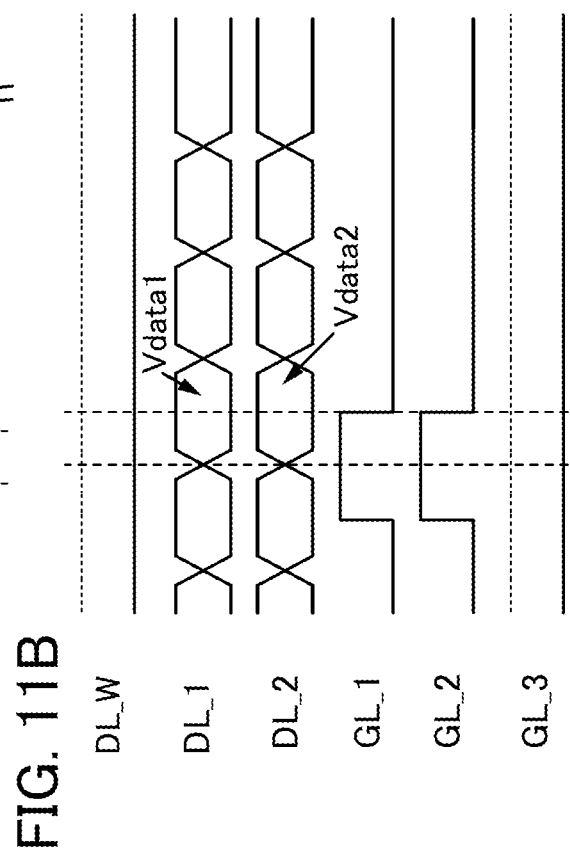

$Q1 = C_1(Vw1 - Vref)$ $Q1 = C_1(Vw1 - Vref)$
$Q2 = C_2(Vw2 - Vref)$ $Q1' = C_1(Vdata1 - Vg)$
$Q2' = C_2(Vdata2 - Vg)$
$Q3' = C_3(Vg - Vel)$ FIG. 18A1
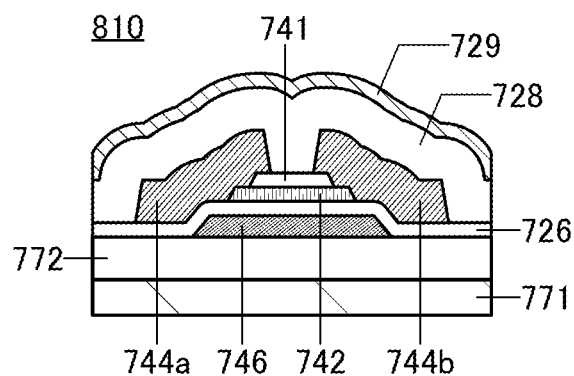
FIG. 18A2
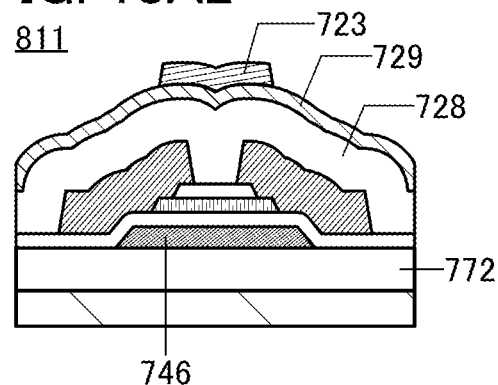
FIG. 18B1
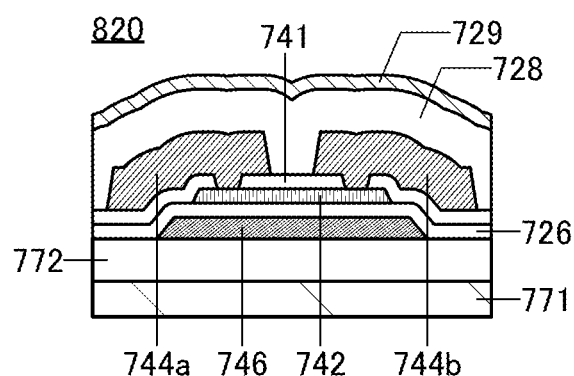
FIG. 18B2
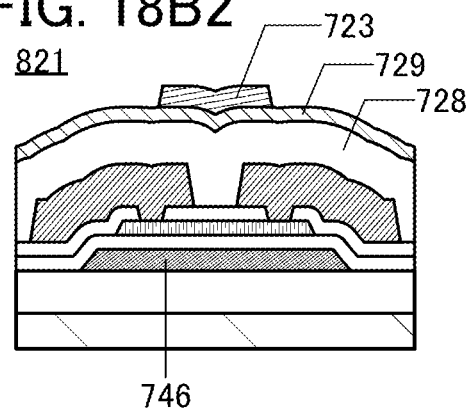
FIG. 18C1
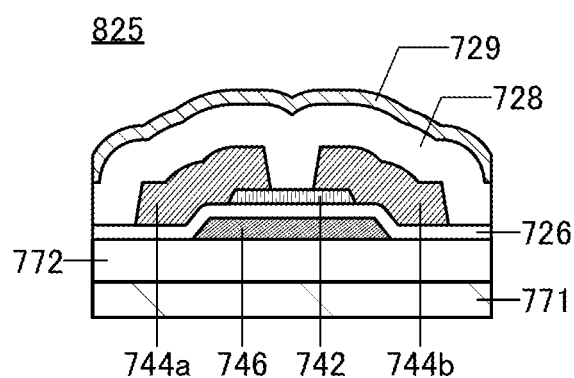
FIG. 18C2
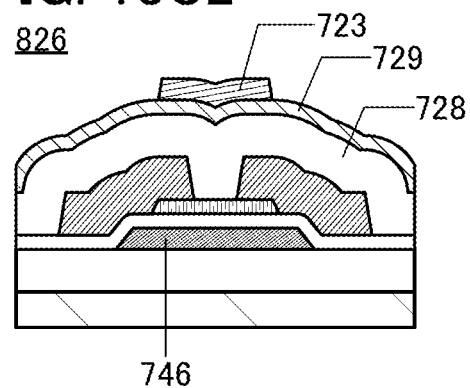

FIG. 19A1
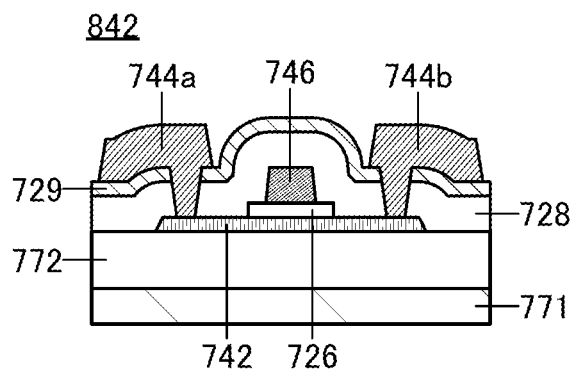
FIG. 19A2
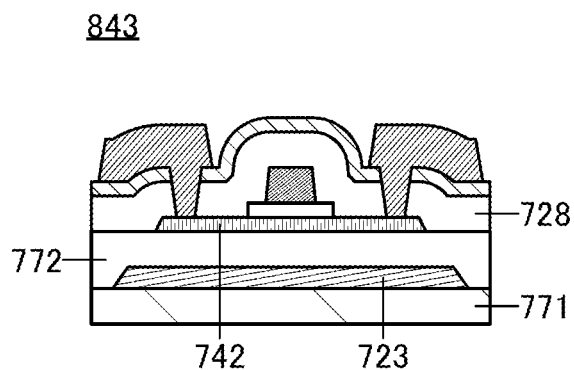
FIG. 19A3
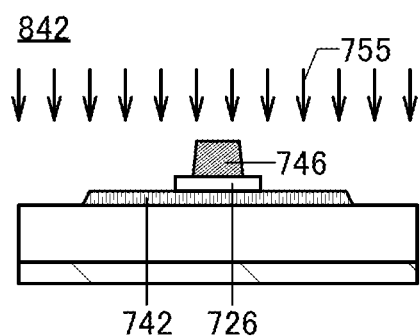
FIG. 19B1
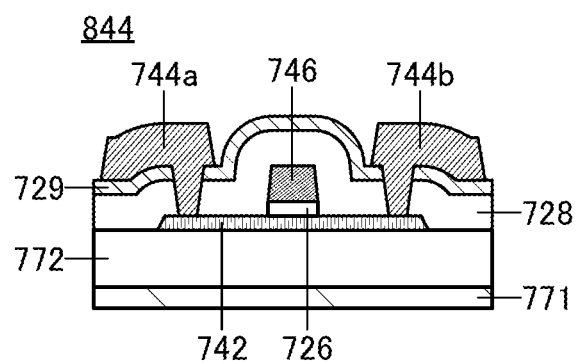
FIG. 19B2
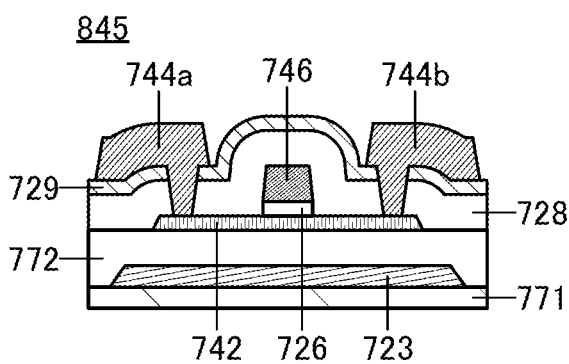
FIG. 19C1
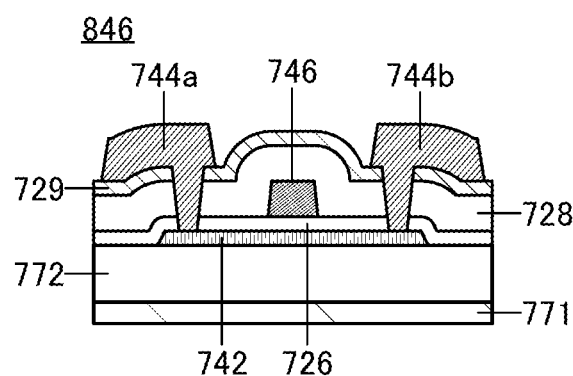
FIG. 19C2
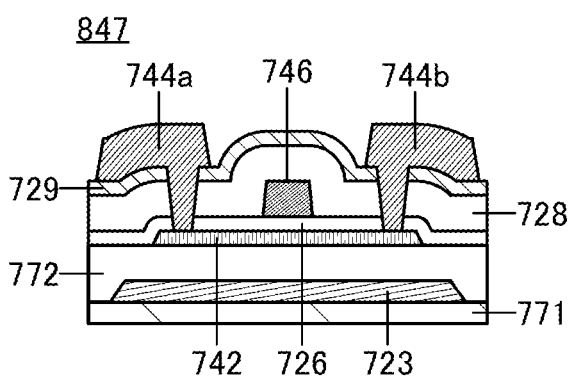

FIG. 21A
FIG. 21B
FIG. 21C
FIG. 21D
FIG. 21E
FIG. 21F
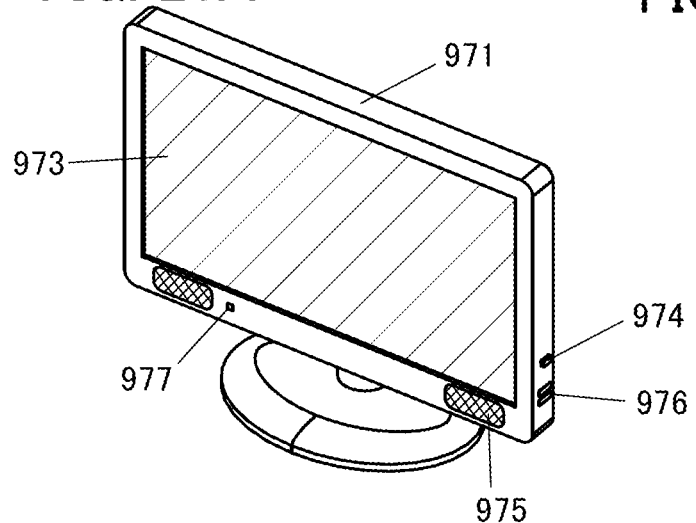
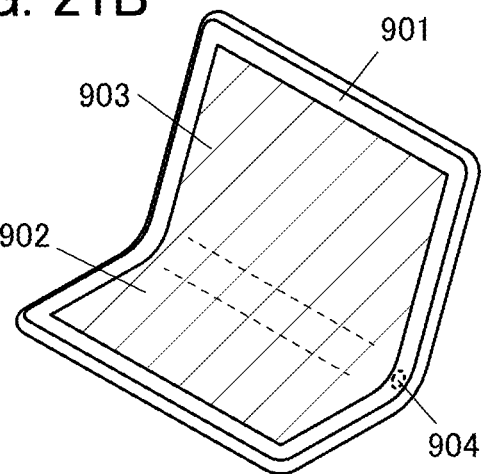
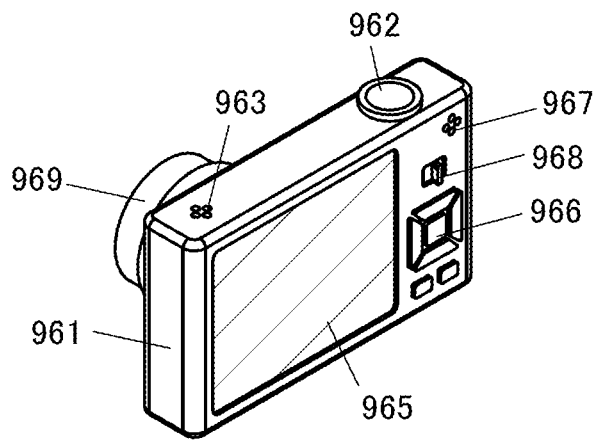
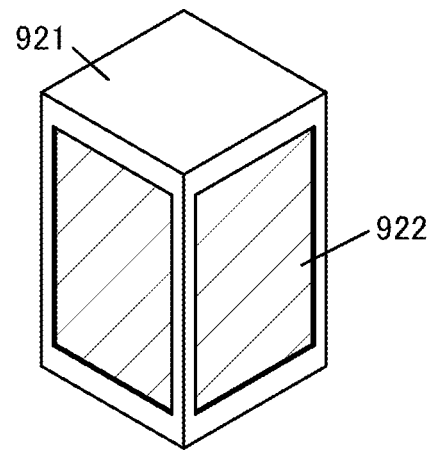
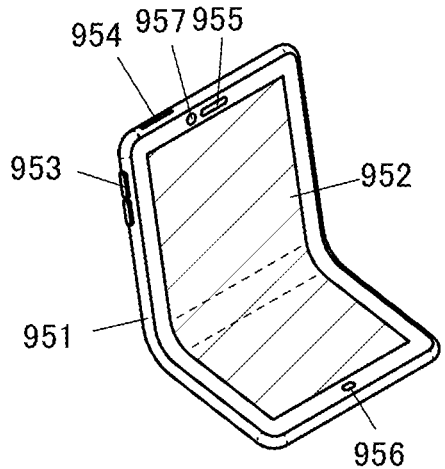
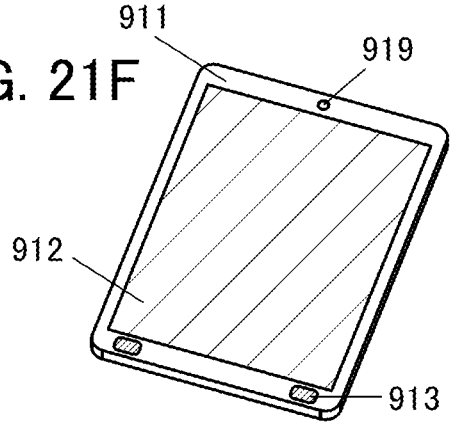

DISPLAY DEVICE, DRIVING METHOD OF DISPLAY DEVICE, AND ELECTRONIC DEVICE

CROSS REFERENCE TO RELATED APPLICATIONS

This application is a continuation of U.S. application Ser. No. 16/756,343, filed Apr. 15, 2020, now allowed, which is incorporated by reference and is a U.S. National Phase Application under 35 U.S.C. § 371 of International Application PCT/IB2018/058462, filed on Oct. 30, 2018, which is incorporated by reference and which claims the benefit of foreign priority applications filed in Japan on Nov. 9, 2017, as Application No. 2017-216322, on Nov. 30, 2017, as Application No. 2017-230410, on Feb. 22, 2018, as Application No. 2018-029712, on Feb. 22, 2018, as Application No. 2018-029714, and on Jun. 6, 2018, as Application No. 2018-108252.

TECHNICAL FIELD

One embodiment of the present invention relates to a display device, a driving method of a display device, and an electronic device.

BACKGROUND ART

A display device in which a memory circuit, an arithmetic processing circuit, and a display processing circuit are incorporated in a pixel and a plurality of pieces of image data can be synthesized has been known (e.g., see Patent Document 1).

A display device is desired to have high image quality. It is effective for obtaining high image quality to increase the number of gray-scale levels of an image to be displayed. For example, Patent Document 2 discloses a display device capable of correcting the luminance of a pixel so that the luminance varies smoothly, by including a driver portion in which pixels are driven using a gray-scale code formed of a plurality of bits and driving intervals in response to the weights of the respective numbers of bits.

REFERENCE

[Patent Document]
[Patent Document 1] United States Patent Application Publication No. 2003/0098875
[Patent Document 2] United States Patent Application Publication No. 2013/0076801

SUMMARY OF THE INVENTION

Problems to be Solved by the Invention

In a configuration in which image synthesis or the like is performed in an arithmetic processing circuit in a pixel, there is a problem in that the amount of arithmetic processing becomes massive with an increase in image data. Another problem lies in that performing display with a high dynamic range is difficult because the voltage amplitude of a signal that can be input to the pixel has an upper limit.

In addition, in a configuration in which a signal like a gray-scale code and a driving interval are combined, driving of a display device becomes complicated. On the other hand, the number of gray-scale levels which can be displayed by a pixel is determined by the number of bits that can be output from a source driver. Therefore, it is difficult to perform display by the pixel with the number of gray-scale levels which is greater than or equal to the number of bits that can be output from the source driver, using signals that can be output from the source driver.

One object of one embodiment of the present invention is to provide a display device capable of performing display with the number of gray-scale levels which is greater than or equal to the number of bits that can be output from a source driver. Another object of one embodiment of the present invention is to provide a display device capable of synthesizing images in a pixel without massively increasing the arithmetic throughput. Another object of one embodiment of the present invention is to provide a display device capable of performing display with a high dynamic range by enabling image display in excess of the voltage amplitude of a signal that can be input to a pixel.

Note that the description of these objects does not disturb the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a display device including a pixel including a first memory circuit, a second memory circuit, a first transistor, and a display element. The pixel is electrically connected to a first wiring, a second wiring, and a third wiring. The first wiring has a function of supplying a first signal and a second signal to the pixel. The second wiring has a function of supplying a third signal and a fourth signal to the pixel. The third wiring has a function of supplying a fifth signal to the pixel. The first memory circuit has a function of retaining the first signal. The second memory circuit has a function of retaining the third signal. The first transistor has a function of controlling current flowing through the display element by application of a voltage, which is obtained by addition of the first signal to the fourth signal, to a gate.

One embodiment of the present invention is preferably a display device in which the first memory circuit includes a second transistor, a third transistor, and a first capacitor, the second memory circuit includes the second transistor, a fourth transistor, and a second capacitor, the second transistor to the fourth transistor each contains a metal oxide in a channel formation region, and the metal oxide contains In, Zn, and M (M is Al, Ti, Ga, Sn, Y, Zr, La, Ce, Nd, or Hf).

One embodiment of the present invention is preferably the display device in which one electrode of the first capacitor is electrically connected to the first wiring through the second transistor, the other electrode of the first capacitor is electrically connected to the second wiring through the third transistor, one electrode of the second capacitor is electrically connected to the first wiring through the second transistor, and the other electrode of the second capacitor is electrically connected to the third wiring through the fourth transistor.

One embodiment of the present invention is preferably the display device in which the pixel includes a third capacitor, one electrode of the third capacitor is electrically connected to a gate of the first transistor, and the other electrode of the third capacitor is electrically connected to one of a source and a drain of the first transistor.

One embodiment of the present invention is preferably the display device in which the pixel is electrically connected to a fourth wiring for feeding current to the light-emitting element, and the other of the source and the drain of the first transistor is electrically connected to the fourth wiring.

One embodiment of the present invention is preferably the display device in which the pixel is electrically connected to a fifth wiring having a function of supplying a constant potential, the pixel includes a fifth transistor, one of a source and a drain of the fifth transistor is electrically connected to the one of the source and the drain of the first transistor, and the other of the source and the drain of the fifth transistor is electrically connected to the fifth wiring.

One embodiment of the present invention is preferably the display device in which the pixel includes a sixth transistor, one of a source and a drain of the sixth transistor is electrically connected to the one of the source and the drain of the first transistor, and the other of the source and the drain of the sixth transistor is electrically connected to one electrode of the display element.

One embodiment of the present invention is preferably the display device in which the display element is an EL element.

One embodiment of the present invention is an electronic device including the above-described display device and a camera.

One embodiment of the present invention is a method for driving a display device including a pixel including a display element, a first memory circuit, a second memory circuit, and a first transistor. A first signal corresponding to a first image is retained in the first memory circuit. A second signal corresponding to a second image is retained in the second memory circuit. A third signal corresponding to a third image is supplied to the first memory circuit in which the first signal is retained so that the third signal is added to the first signal, and a fourth signal corresponding to a fourth image is supplied to the second memory circuit in which the second signal is retained so that the fourth signal is added to the second signal, whereby an image which is obtained by superimposing the first image to the fourth image corresponding to the first signal to the fourth signal is displayed by the display element.

One embodiment of the present invention is a display device including a pixel including a first memory circuit, a second memory circuit, a first transistor, and a display element. The pixel is electrically connected to a first wiring supplying a first signal or a second signal. The pixel is electrically connected to a third wiring supplying a reference voltage or a third signal. The pixel is electrically connected to a fourth wiring supplying a reference voltage or a fourth signal. The first memory circuit has a function of retaining the first signal. The second memory circuit has a function of retaining the second signal. The first transistor has a function of controlling current flowing through the display element by application of a voltage, which is obtained by addition of the first to fourth signals, to a gate.

One embodiment of the present invention is a method for driving a display device including a pixel provided with a display element, a first memory circuit, a second memory circuit, and a first transistor. The method for driving a display device is characterized in that a first signal is retained in the first memory circuit; a second signal is retained in the second memory circuit; and a third signal is supplied to the first memory circuit in which the first signal is retained, a fourth signal is supplied to the second memory circuit in which the second signal is retained, and on/off of each switch included in the first memory circuit and the second memory circuit is controlled, whereby an image is displayed in combination with the first signal, a signal obtained by adding the first signal and the second signal, a signal obtained by adding the first to the third signals, and a signal obtained by adding the first to the fourth signals.

Note that other embodiments of the present invention will be shown in the following embodiments and the drawings.

Effect of the Invention

In one embodiment of the present invention, a display device capable of performing display with the number of gray-scale levels which is greater than or equal to the number of bits that can be output from a source driver can be provided. Alternatively, in one embodiment of the present invention, a display device capable of synthesizing images in a pixel without massively increasing the amount of arithmetic processing can be provided. Alternatively, in one embodiment of the present invention, a display device capable of performing display with a high dynamic range by enabling image display in excess of the voltage amplitude of a signal that can be input to a pixel can be provided.

Note that the descriptions of these effects do not disturb the existence of other effects. One embodiment of the present invention does not have to achieve all the effects. Other effects will be apparent from and can be derived from the descriptions of the specification, the drawings, the claims, and the like.

BRIEF DESCRIPTION OF THE DRAWINGS

FIG. 6 A diagram showing an operation example of a display device.

FIGS. 11A and 11B Timing charts showing configuration examples of a display device.

FIGS. 18A1, 18A2, 18B1, 18B2, 18C1, and 18C2 Diagrams showing structure examples of a transistor.

FIGS. 19A1, 19A2, 19A3, 19B1, 19B2, 19C1, and 19C2 Diagrams showing structure examples of a transistor.

FIGS. 21A to 21F Diagrams showing examples of electronic devices.

MODE FOR CARRYING OUT THE INVENTION

Figure 1A:
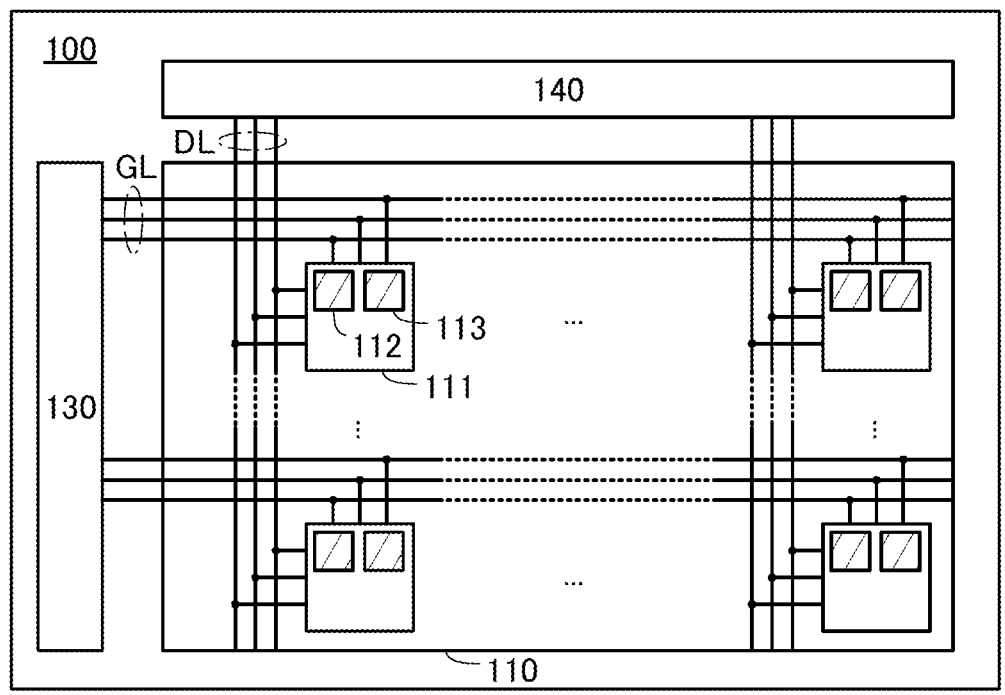
FIGS. 1A and 1B A block diagram and a circuit diagram showing a configuration example of a display device.

Embodiments will be described below with reference to the drawings. Note that the embodiments can be implemented in many different modes, and it will be readily appreciated by those skilled in the art that the modes and details can be changed in various ways without departing from the spirit and scope thereof. Thus, the present invention should not be interpreted as being limited to the description of the following embodiments.

Note that in this specification and the like, ordinal numbers such as "first", "second", and "third" are used in order to avoid confusion among components. Thus, the terms do not limit the number of components. In addition, the terms do not limit the order of components. For example, in this specification and the like, a "first" component in one embodiment can be a "second" component in other embodiments or the scope of claims. Also, for example, in this specification and the like, a "first" component in one embodiment can be omitted in other embodiments or the scope of claims.

Note that in the drawings, the same elements, elements having similar functions, elements with the same material, elements formed at the same time, or the like are sometimes denoted by the same reference numerals, and repeated description thereof is omitted in some cases.

Embodiment 1

In this embodiment, a display device of one embodiment of the present invention will be described with reference to drawings.

FIG. 1(A) shows a block diagram of a display device 100. The display device 100 includes a display portion 110 including a plurality of pixels 111, a gate driver 130, and a data driver 140.

The pixel 111 includes a memory circuit 112 and a memory circuit 113. A display element, a transistor for driving the display element, and the like are included in the pixel 111 though not illustrated in FIG. 1(A). The pixel 111 is supplied with signals from the gate driver 130 through a plurality of wirings GL to control the driving. In addition, the pixel 111 is supplied with signals from the data driver 140 through a plurality of wirings DL to control the driving.

The plurality of wirings GL each have a function as a scan line. The signal that the wiring GL transmit has a function as a scan signal. The scan signal is also referred to as a control signal. The scan signal is a signal for controlling the conduction state or non-conduction state (on/off) of a transistor functioning as a switch in the pixel 111. The signal that the wiring GL transmits is output from the gate driver 130.

The plurality of wirings DL each have a function as a data line. The signal that the wiring DL transmits has a function as a data signal. The data signal is also referred to as image data or an image signal. The data signal is a signal for performing image display. In addition to the signals retained in the memory circuit 112 and the memory circuit 113, examples of the data signal include a signal subsequently supplied to the memory circuit 112 and the memory circuit 113 which retain the signals. The wiring DL also has a function of a wiring for supplying a voltage necessary for driving the pixel 111, for example, a reference voltage. The signal that the wiring DL transmits is output from the data driver 140.

The memory circuit 112 and the memory circuit 113 each include a capacitor and a transistor. The memory circuit 112 and the memory circuit 113 each have a function of retaining the signal supplied through the wiring DL in the capacitor as charge (a potential). In addition, the memory circuit 112 and the memory circuit 113 each have a function of retaining a voltage obtained by adding potentials of signals subsequently written thereto to the retained potential by being supplied with other signals through the wiring DL. Specifically, signals can be added by utilizing capacitive coupling of the capacitor. Note that retaining the signal supplied to each of the memory circuit 112 and the memory circuit 113 through the wiring DL in the capacitor as charge can also referred to as retention of the signal.

Note that in this specification and the like, a pixel refers to one element whose brightness can be controlled, for example. Therefore, for example, one pixel expresses one color element by which brightness is expressed. Accordingly, in the case of a color display device formed of color elements of R (red), G (green), and B (blue), the minimum unit of an image is formed of three pixels of an R pixel, a G pixel, and a B pixel. In this case, each of the RGB pixels is referred to as a subpixel, and the RGB pixels are collectively referred to as a pixel.

Figure 1B:
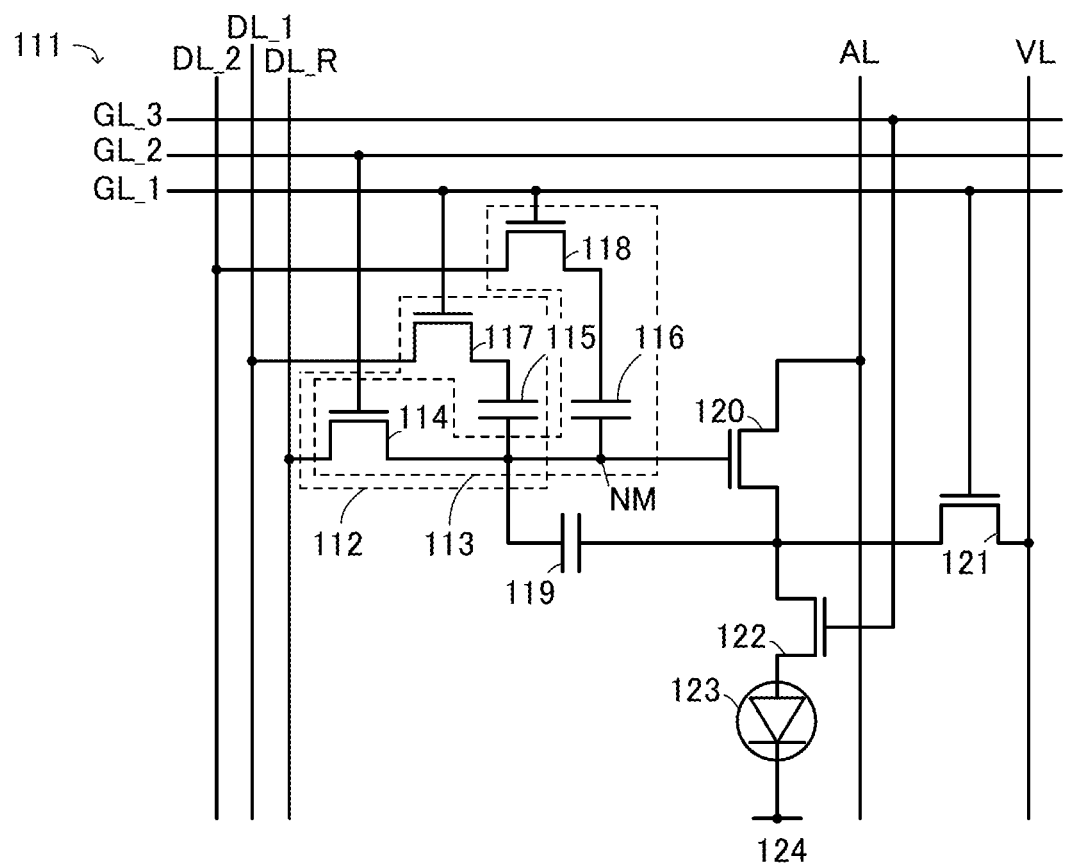

Next, FIG. 1(B) illustrates a configuration example of the pixel 111. The pixel 111 includes a transistor 114, a transistor 117, a transistor 118, a transistor 120, a transistor 121, a transistor 122, a capacitor 115, a capacitor 116, a capacitor 119, and a light-emitting element 123. In FIG. 1(B), a node to which a gate of the transistor 120 is connected is illustrated as a node NM. Note that although the transistors illustrated in FIG. 1(B) are all n-channel transistors, p-channel transistors can also be used.

The transistor 120 has a function of controlling the amount of current flowing through the light-emitting element 123. The transistors other than the transistor 120 have functions of switches. The memory circuit 112 includes the capacitor 115, the transistor 114, and the transistor 117. The memory circuit 113 includes the capacitor 116, the transistor 114, and the transistor 118. Note that the memory circuit 112 and the memory circuit 113 each add a signal by retaining charge to one of electrodes of the capacitor; therefore, the transistor 117 and the transistor 118 are not included in the memory circuit 112 and the memory circuit 113 in some cases.

In FIG. 1(B), a wiring GL_1, a wiring GL_2, and a wiring GL_3 are illustrated as the wirings GL illustrated in FIG. 1(A). The wiring GL_1, the wiring GL_2, and the wiring GL_3 each have a function of transmitting a signal for controlling the on/off of the transistor functioning as a switch to the pixel 111.

In FIG. 1(B), a wiring DL_1, a wiring DL_2, and a wiring DL_R are illustrated as the wirings DL illustrated in FIG. 1(A). The wiring DL_1 and the wiring DL_2 each have a function of transmitting a signal for performing image display to the pixel 111. The wiring DL_R has a function of a wiring for supplying a reference voltage necessary for driving the pixel 111.

The capacitor 115 or the capacitor 116 has a function of retaining a signal written to the memory circuit 112 or the memory circuit 113 as charge. The transistor 114, the transistor 117, and the transistor 118 which are electrically connected to the one electrode or the other electrode of the capacitor 115 or the capacitor 116 each have a function of retaining charge corresponding to a signal in the electrode of the capacitor 115 or the capacitor 116 by being turned on. The transistor 114, the transistor 117, and the transistor 118 each have a function of retaining charge in the electrode of the capacitor 115 or the capacitor 116 by being turned off. The transistor 114, the transistor 117, and the transistor 118 each have a function of bringing the node of the one electrode of the capacitor 115 or the capacitor 116 into an electrically floating state (floating).

As illustrated in FIG. 1(B), the one electrode of the capacitor 115 is connected to the wiring DL_R through the transistor 114. The other electrode of the capacitor 115 is connected to the wiring DL_1 through the transistor 117. The one electrode of the capacitor 116 is connected to the wiring DL_R through the transistor 114. The other electrode of the capacitor 116 is connected to the wiring DL_2 through the transistor 118.

The transistor 114, the transistor 117, and the transistor 118 preferably have a low current flowing in the off state (off-state current). The use of a transistor with a noticeably low off-state current allows the potential of the node NM to be retained for a long time. As the transistor, a transistor using a metal oxide in a channel formation region (hereinafter referred to as an OS transistor) can be used, for example. A structure in which the metal oxide includes In, Zn, and M (M is Al, Ti, Ga, Sn, Y, Zr, La, Ce, Nd, or Hf) is employed. An OS transistor will be described in detail in an embodiment below.

The capacitor 119 has a function of retaining the voltage between the gate and a source of the transistor 120. One electrode of the capacitor 119 is connected to the gate of the transistor 120. The other electrode of the capacitor 119 is connected to one electrode of the source and a drain (the source side) of the transistor 120. The other of the source and the drain (the drain side) of the transistor 120 is connected to a wiring AL. The wiring AL is supplied with a voltage for feeding current to the light-emitting element 123. The wiring AL has a function as a current supply line or an anode line.

The transistor 121 has a function as a switch for controlling electrical continuity between a wiring VL and the one of the source and the drain (the source side) of the transistor 120. One of a source and a drain of the transistor 121 is connected to the one of the source and the drain of the transistor 120. The other of the source and the drain of the transistor 121 is connected to the wiring VL. The wiring VL is a wiring for supplying a constant potential (V0). The wiring VL may be configured to have a function of outputting current flowing through the transistor 120 to the outside. With such a configuration, the current flowing through the transistor 120 can be monitored periodically, so that correction in accordance with variation of the transistor 120 can be performed.

The transistor 122 has a function as a switch for controlling electrical continuity between the one of the source and the drain (the source side) of the transistor 120 and one electrode of the light-emitting element 123. One of a source and a drain of the transistor 122 is connected to the one of the source and the drain of the transistor 120. The other of the source and the drain of the transistor 122 is connected to the one electrode of the light-emitting element 123. The other electrode of the light-emitting element 123 is connected to a wiring 124. The wiring 124 has a function as a cathode line. The transistor 122 is an element for preventing a defect in that unintended current flows when the potential of the node NM is greater than or equal to the threshold voltage (Vth) of the transistor 120. Specifically, the transistor 122 functions as a switch for preventing current from flowing during a period other than the period in which current is fed to the light-emitting element 123 (a light-emitting period). In the structure of one embodiment of the present invention, the potential of the node NM is easily increased because of an operation of retaining charge in the gate of the transistor 120 and superimposing signals. Thus, a configuration for preventing the light-emitting element 123 from emitting light is effective. Note that the light-emitting element 123 is a display element whose luminance can be controlled in accordance with the amount of current flowing therethrough; for example, an organic EL element can be applied.

In one embodiment of the present invention, signals for displaying an image are supplied to a pixel and are retained in a plurality of memory circuits and then a plurality of signals for displaying another image are supplied to the pixel. FIG. 1(B) has a configuration in which signals for displaying an image are retained in two memory circuits and then a plurality of signals for displaying another image are supplied to the pixel from the wiring DL_1 and the wiring DL_2.

This configuration enables a configuration in which to the memory circuit in which the two signals are retained in advance, other two signals are added, and current flowing through the light-emitting element is controlled on the basis of signals corresponding to the signals based on four images. Therefore, the display portion provided with the pixel can display images based on the four signals by superimposition. Accordingly, the images can be synthesized in the pixel without massively increasing the arithmetic throughput in a configuration simpler than a configuration in which an arithmetic processing circuit is provided in a pixel. In addition, the dynamic range of the display device can be raised because the display device can display an image corresponding to an image signal having a potential higher than a potential that a source driver or the like can generate.

Figure 2A:
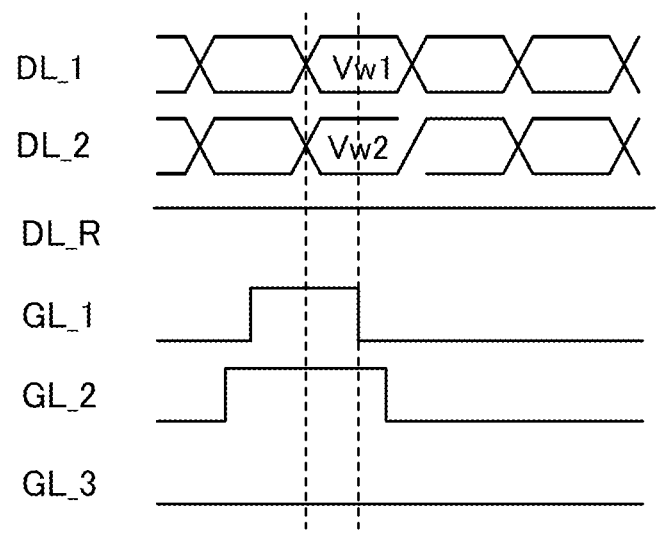
FIGS. 2A and 2B Timing charts showing a configuration example of a display device.
Figure 2B:
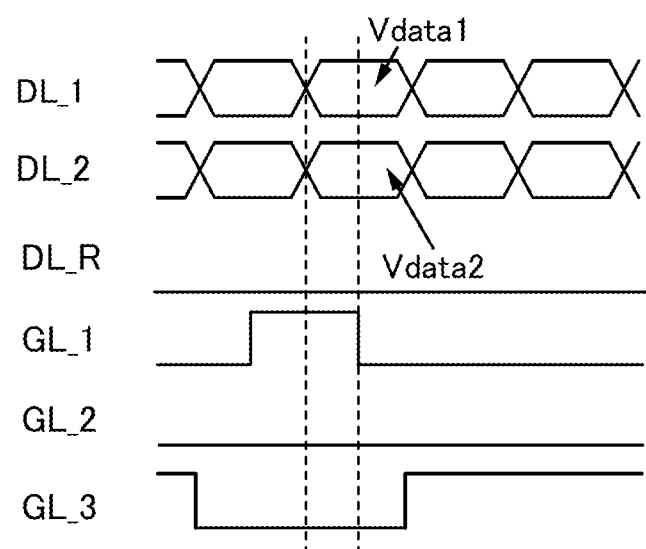
Figure 3A:
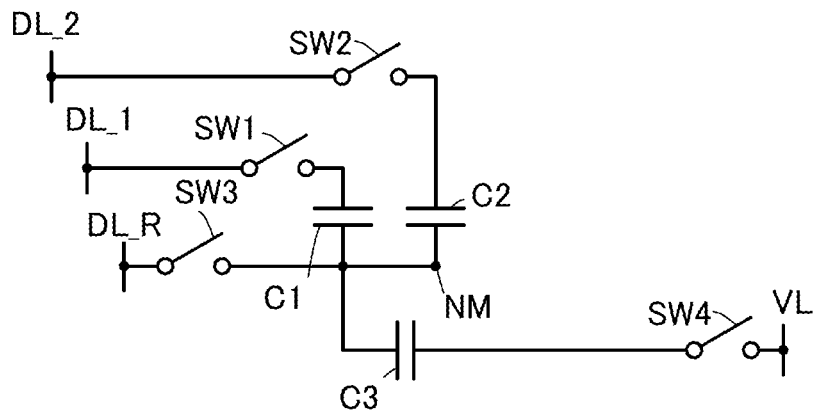
FIGS. 3A to 3C Circuit diagrams showing configuration examples of a display device.
Figure 3B:
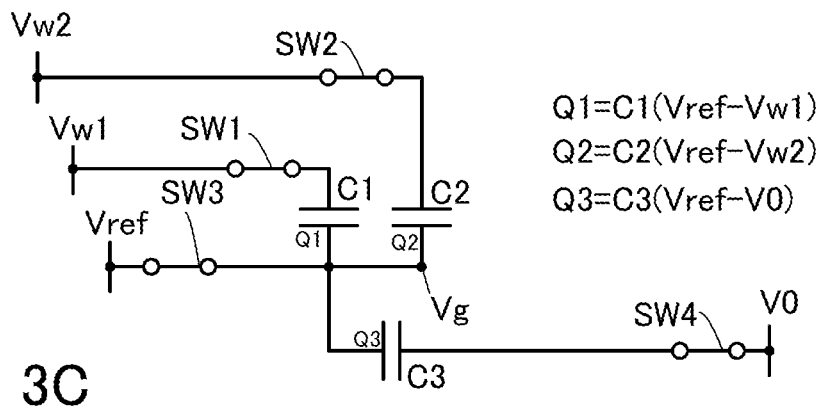
Figure 3C:
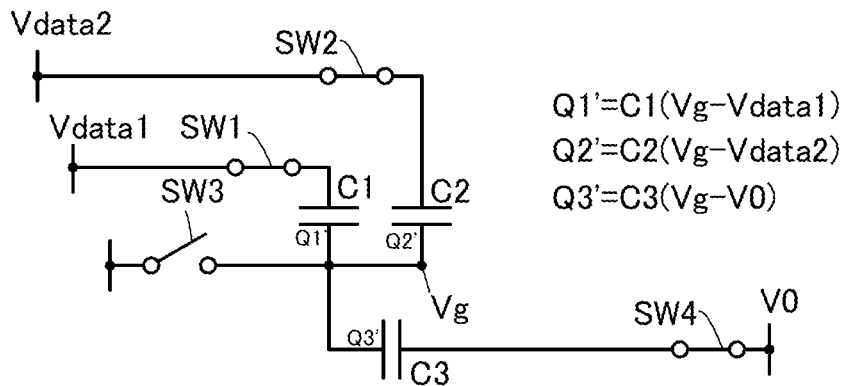

An example of a driving method of the pixel 111 is described with reference to timing charts illustrated in FIGS. 2(A) and 2(B) and circuit diagrams illustrated in FIGS. 3(A) to 3(C). FIG. 2(A) illustrates an operation of writing signals retained in the memory circuit 112 and the memory circuit 113, and FIG. 2(B) illustrates an operation of superimposing images by adding other signals to the signals retained in the memory circuit 112 and the memory circuit 113. Note that in the timing charts in FIGS. 2(A) and 2(B), the waveforms of signals supplied to the wirings GL_1 to GL_3, DL_1, DL_2, and DL_R are illustrated.

Note that the signal supplied to the wiring DL_1 is $W_1$, and the voltage retained in the memory circuit 112 by the signal is Vw1. Note that the signal supplied to the wiring DL_2 is $W_2$, and the voltage retained in the memory circuit 113 by the signal is Vw2. A signal written to the pixel 111 through the wiring DL_1 with the voltage Vw1 retained in the memory circuit 112 is data_1, and a voltage applied to the memory circuit 112 by the signal is Vdata1. A signal written to the pixel 111 through the wiring DL_2 with the voltage Vw2 retained in the memory circuit 113 is data_2, and a voltage applied to the memory circuit 113 by the signal is Vdata2.

First, an operation of writing the signals $W_1$ and $W_2$ which are to be retained in the memory circuit 112 and the memory circuit 113 are described with reference to FIG. 2(A). Description of the operations in FIGS. 2(A) and 2(B) is made with reference to the circuit diagrams in FIGS. 3(A) to 3(C) for simplifying the description. FIGS. 3(A) to 3(C) illustrate the main parts of the circuit diagram in FIG. 1(B);

the transistors each functioning as a switch are illustrated as switches SW1 to SW4 and the capacitances of the capacitors 115, 116, and 119 are illustrated as C1, C2, and C3. The switches SW1 to SW4 correspond to the transistor 117, the transistor 118, the transistor 114, and the transistor 121 in FIG. 1(B), respectively.

In the case where the voltages Vw1 and Vw2 based on the signals $W_1$ and $W_2$ are written to the memory circuit 112 and the memory circuit 113, the wiring DL_1 is set to the voltage Vw1, the wiring DL_2 is set to the voltage Vw2, the wiring DL_R is set to Vref (reference voltage), and the wiring VL is set to a voltage V0. Note that the value of Vref supplied to the wiring DL_R is preferably determined in advance so that Vref−Vw1 has a positive value. In the case of image data, the voltage Vw1 can suppress inversion of an image by supply of inverted data in advance. The signals supplied to the wiring GL_1 and the wiring GL_2 are each set to an H level in a state where the potential of each wiring is set to a predetermined voltage. That is, the switches SW1 to SW4 are turned on as illustrated in FIG. 3(B). Then, the voltages Vref and Vw1 are applied to the electrodes on both ends of the capacitor 115. At this time, Equation (1) can be obtained when the amount of charge accumulated in the electrode of the capacitor 115 on the node NM side is represented by Q1.

$$Q1 = C1(Vref - Vw1) \quad (1)$$

At this time, in a similar manner, Equations (2) and (3) can be obtained when the amounts of charge accumulated in the electrodes of the capacitor 115 and the capacitor 119 on the node NM side are Q2 and Q3.

$$Q2 = C2(Vref - Vw2) \quad (2)$$

$$Q3 = C3(Vref - V0) \quad (3)$$

Next, an operation of adding the signals data_1 and data_2 to the pixel 111 through the wirings DL_1 and DL_2 in a state where the voltage Vw1 and the voltage Vw2 based on the signals $W_1$ and $W_2$ are retained in the memory circuit 112 and the memory circuit 113 is described with reference to FIG. 2(B).

In the case where the signals data_1 and data_2 are written to the memory circuit 112 and the memory circuit 113, a signal supplied to the wiring GL_1 is set to an H level and a signal supplied to the wiring GL_2 is set to an L level in a state where the wiring DL_1 is Vdata1, the wiring DL_2 is Vdata2, the wiring DL_R is an L level such as VSS, and the wiring VL is the voltage V0. During a period in which the voltages Vdata1 and Vdata2 are written to the memory circuit 112 and the memory circuit 113, a signal supplied to the wiring GL_3 is set to an L level. That is, the switches SW1, SW2, and SW4 are turned on and the switch SW3 is turned off, as illustrated in FIG. 3(C). Then, the one electrode of the capacitor 115 is brought into an electrically floating state, and the voltage of the other electrode changes from Vw1 to vdata1. At this time, Equation (4) can be obtained when the voltage of the node NM of the capacitor 115 is Vg and the amount of charge accumulated in the electrode on the node NM side is Q1'. Vg is a voltage that changes by capacitive coupling.

$$Q1' = C1(Vg - Vdata1) \quad (4)$$

At this time, in a similar manner, Equations (5) and (6) can be obtained when the amounts of charge accumulated in the electrodes of the capacitor 116 and the capacitor 119 on the node NM side are Q2' and Q3'.

$$Q2' = C2(Vg - Vdata2) \quad (5)$$

$$Q3' = C3(Vg - V0) \quad (6)$$

During the operations in FIGS. 2(A) and 2(B), the principle of conservation of charge at the node NM is satisfied because the off-state currents of the switches SW1 to SW3 are extremely low. That is, Equation (7) is satisfied.

$$Q1 + Q2 + Q3 = Q1' + Q2' + Q3' \quad (7)$$

Equation (8) is satisfied when Equation (7) is solved for Vg.

[Formula 1]

According to Equation (8), the voltage Vg can be obtained by adding up a voltage −Vw1, a voltage −Vw2, the voltage Vdata1, and the voltage Vdata2; therefore, images can be superimposed using the signals retained in the memory circuits and subsequent signals.

The display device of one embodiment of the present invention can display four superimposed images at the maximum, using the signals $W_1$ and $W_2$ retained in the memory circuits and the signals data_1 and data_2 to be subsequently written.

Figure 4:
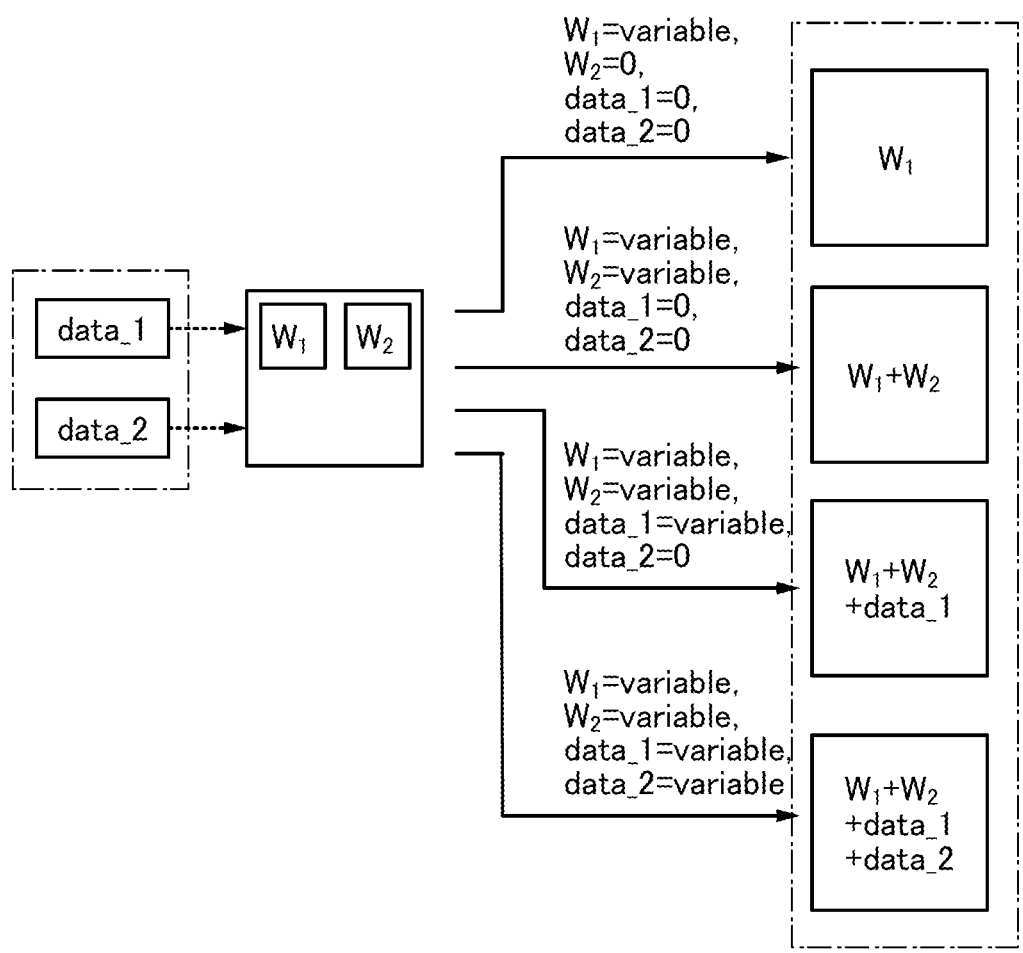
FIG. 4 A diagram showing an operation example of a display device.

Specifically, as illustrated in FIG. 4, in a configuration in which the signal $W_1$ is retained in the pixel and then other signals are not written, an image based on the signal $W_1$ can be displayed by making the signal $W_1$ variable, and fixing other signals or writing no signals (=0). Alternatively, an image based on the signals $W_1$ and $W_2$, i.e., an image obtained by superimposition of two images can be displayed by making the signals $W_1$ and $W_2$ variable, and fixing other signals or writing no signals (=0). Alternatively, an image based on the signals $W_1$, $W_2$, and data_1, i.e., an image obtained by superimposition of three images can be displayed by making the signals $W_1$, $W_2$, and data_1 variable, and fixing other signals or writing no signals (=0). Alternatively, an image based on the signals $W_1$, $W_2$, data_1, and data_2, i.e., an image obtained by superimposition of four images can be displayed by making the signals $W_1$, $W_2$, data_1, and data_2 variable. Note that the signals $W_1$ and $W_2$ are preferably signals based on image data with low update frequency because of being retained in the memory circuit 112 and the memory circuit 113.

A more specific configuration example is described with reference to FIG. 5 and FIG. 6. In FIG. 5 and FIG. 6, the display device of one embodiment of the present invention is described using images displayed on the display device with the image data and display objects displayed in the images. In FIG. 5 and FIG. 6, superimposition of the signals in the above description is described as superimposition of images.

Figure 5A:
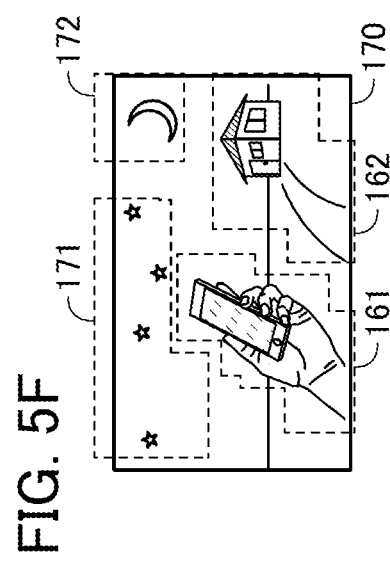
FIGS. 5A to 5H Diagrams showing operation examples of a display device.
Figure 5B:
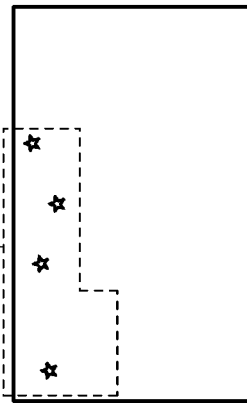
Figure 5C:
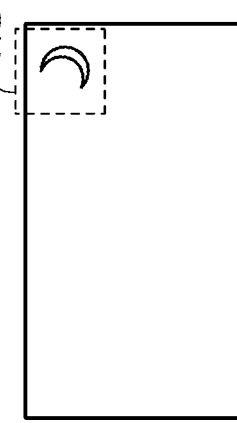
Figure 5D:
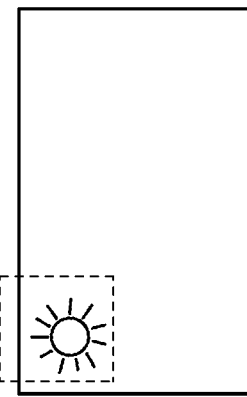
Figure 5E:
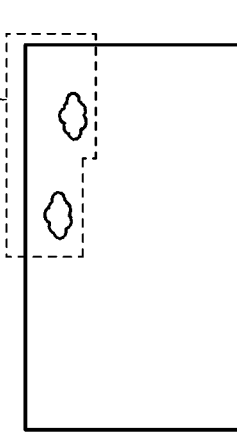

FIG. 5(A) illustrates an image 160. A display object 161, a display object 162, a display object 163, and a display object 164 are illustrated in the image 160. FIGS. 5(B) to 5(E) illustrate images 160A to 160D. As illustrated, the images 160A to 160D are images of the display objects 161 to 164 illustrated in FIG. 5(A), which are separately displayed. The display device of one embodiment of the present invention can display up to four images by superimposition, using the signals $W_1$ and $W_2$ retained in the memory circuits and the signals data_1 and data_2 to be subsequently written. For example, the images 160A and 160B illustrated in FIGS. 5(B) and 5(C) are retained in advance using the signals $W_1$ and $W_2$ retained in the memory circuit 112 and the memory circuit 113, and the images 160C and 160D illustrated in FIGS. 5(D) and 5(E) are written as the signal data_1 and the signal data_2, whereby the image 160 in FIG. 5(A) which is a desired image can be displayed by superimposition.

Figure 5F:
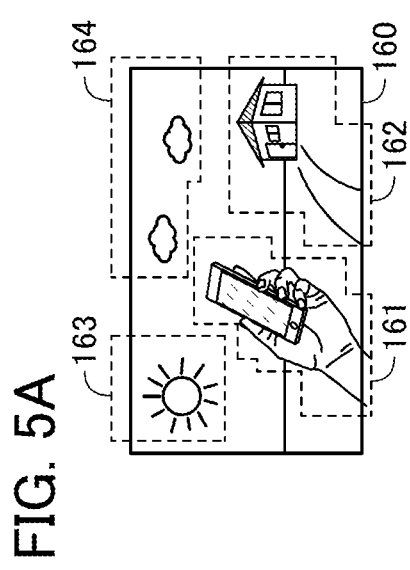
Figure 5G:
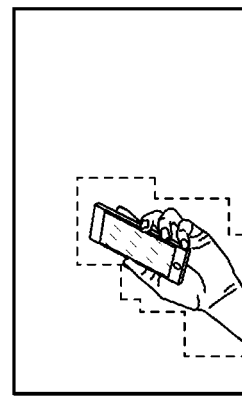
Figure 5H:
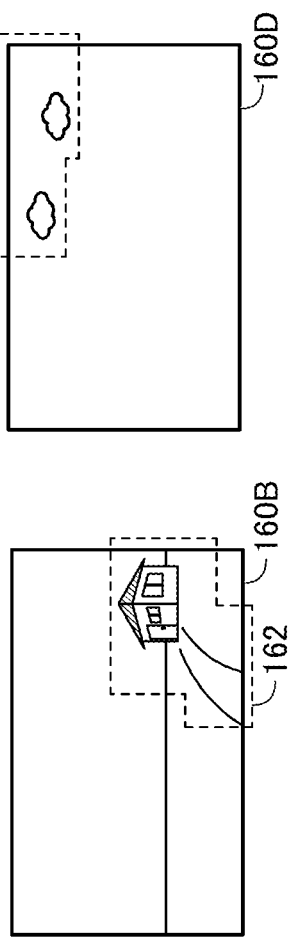

As another image, an image 170 is illustrated in FIG. 5(F). The display object 161, the display object 162, a display object 171, and a display object 172 are illustrated in the image 170. FIGS. 5(G) and 5(H) illustrate images 170A and 170B. As illustrated, the images 170A and 170B are images of the display objects 171 and 172 illustrated in FIG. 5(F), which are separately displayed. The display device of one embodiment of the present invention can display up to four images by superimposition, using the signals $W_1$ and $W_2$ retained in the memory circuits and the signals data_1 and data_2 to be subsequently written. For example, the images 160A and 160B illustrated in FIGS. 5(B) and 5(C) are retained in advance with the signals $W_1$ and $W_2$ retained in the memory circuit 112 and the memory circuit 113, and the images 170A and 170B illustrated in FIGS. 5(G) and 5(H) are written as the signal data_1 and the signal data_2, whereby the image 170 in FIG. 5(F) which is a desired image can be displayed by superimposition. The use of the signals $W_1$ and $W_2$ retained in the memory circuit 112 and the memory circuit 113 is effective in reducing power consumption because the number of respective image writings can be reduced.

Note that although in the example described with reference to FIGS. 5(A) to 5(H), the configuration in which one image is displayed by superimposing different display objects is described, one embodiment of the present invention is also effective in another configuration. For example, as illustrated in FIG. 6, a configuration in which a signal of an image with high luminance (e.g., an image of the sun) like the display object 163 of the image 160C is retained as the signal W retained in the memory circuit is effective. Then, as in the image 160, signals including the display objects 161 to 164 are written as the signals data to be subsequently written and display by superimposition (data+W) is performed, whereby the luminance of the display object 163 in an obtained image 160HD can be increased (improvement in luminance is illustrated by bold lines). As described above, one embodiment of the present invention can also achieve image processing such as high-dynamic range (HDR) processing with a simple configuration. It is also possible to contain information of text or the like in the display by superimposition.

Figure 7A:
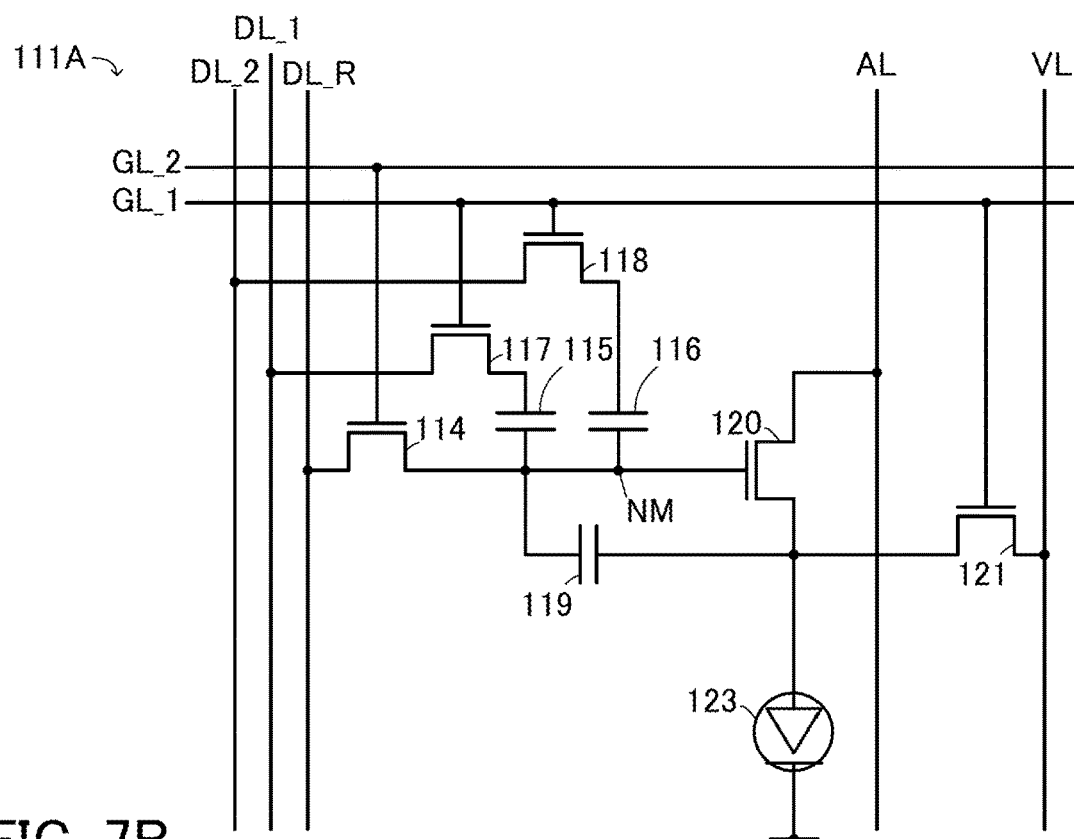
FIGS. 7A and 7B Circuit diagrams showing configuration examples of a display device.

Next, a modification example of the pixel 111 is described. The pixel 111 can also have a configuration of a pixel 111A illustrated in FIG. 7(A). The pixel 111A has the same configuration as the pixel 111 except that the transistor 122 is not provided.

As described above, the transistor 122 is provided to solve a malfunction that occurs in the case where the voltage of a signal written to the node NM is higher than or equal to the threshold voltage (Vth) of the transistor 120. Note that as long as the voltage of the signal to be written to the node NM is limited to a value lower than Vth, the transistor 122 can be omitted.

Figure 7B:
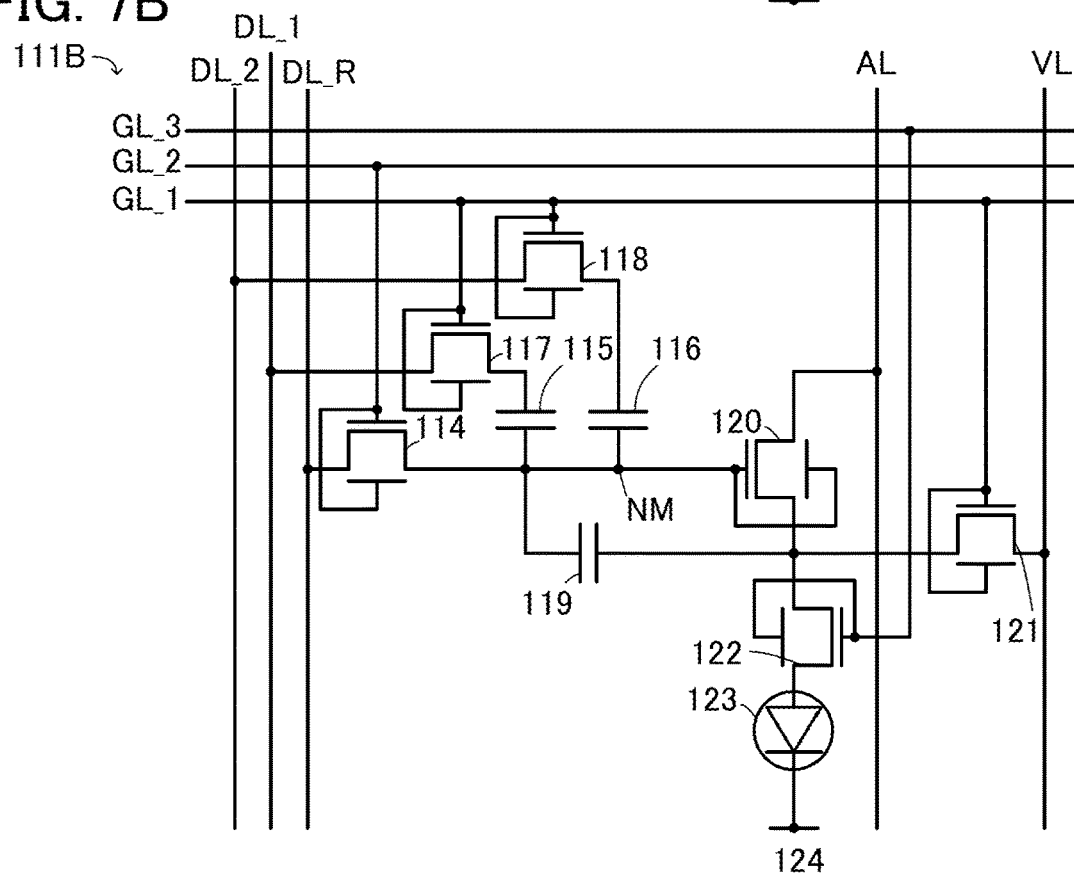

Alternatively, the pixel 111 can also have a configuration of a pixel 111B illustrated in FIG. 7(B). The pixel 111B has a configuration in which each transistor is provided with a back gate. The back gate is electrically connected to a front gate and has an effect of increasing on-state current. Alternatively, a configuration may be employed in which a fixed potential which is different from that of the front gate can be supplied to the back gate. Such a configuration enables control of the threshold voltage of the transistor. Note that although FIG. 7(B) illustrates a configuration in which all of the transistors are provided with a back gate, a transistor not provided with a back gate may also be included. A configuration in which a transistor includes a back gate is also effective for another pixel circuit in this embodiment.

Figure 8A:
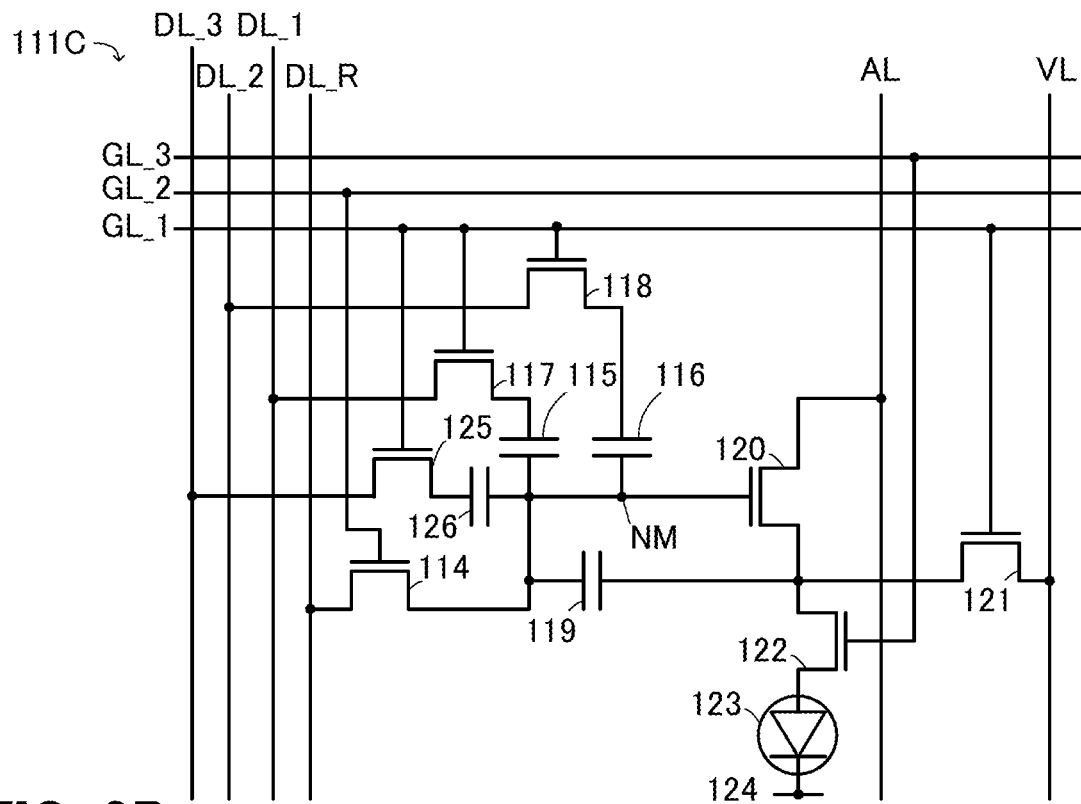
FIGS. 8A and 8B Circuit diagrams showing configuration examples of a display device.

Alternatively, the pixel 111 can also have a configuration of a pixel 111C illustrated in FIG. 8(A). The circuit of the pixel 111C has a configuration in which a transistor 125 and a capacitor 126 which function as a memory circuit are added. A signal is supplied to the memory circuit added to the pixel 111 through a wiring DL_3. Addition of the memory circuit as in FIG. 8(A) enables a display device including a pixel provided with three or more memory circuits.

Figure 8B:
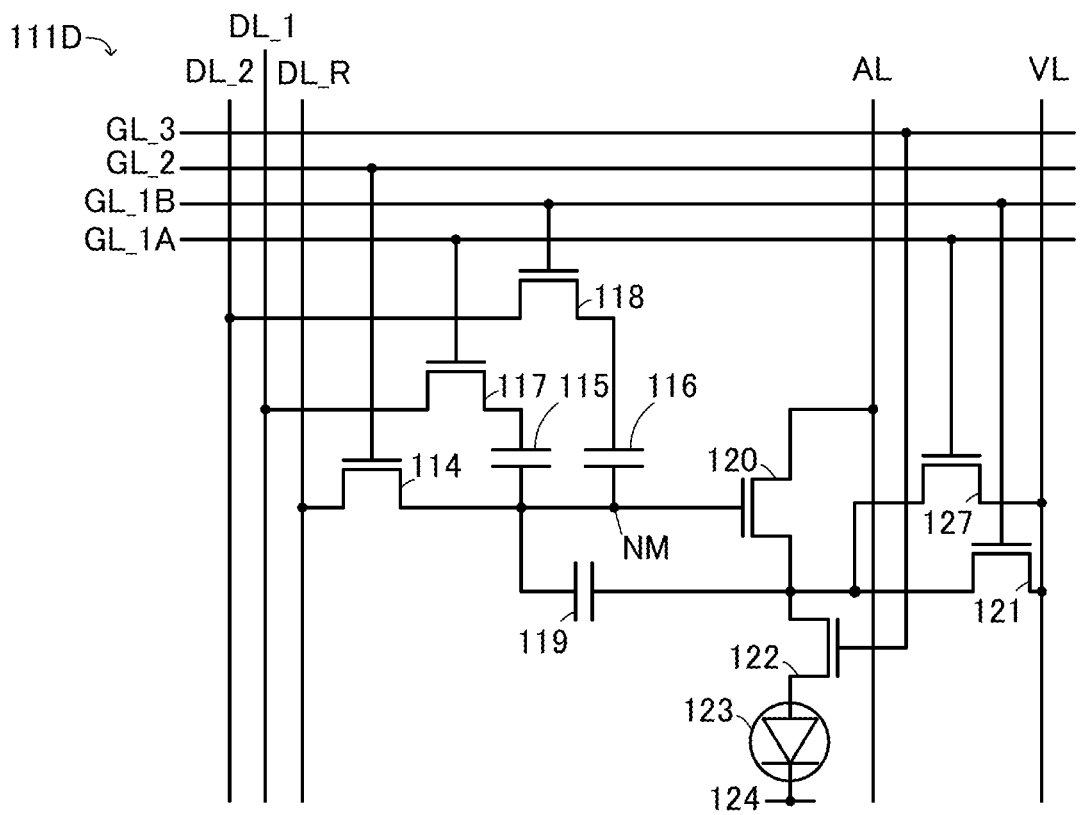

Alternatively, the pixel 111 can also have a configuration of a pixel 111D illustrated in FIG. 8(B). The pixel 111D, in which the function of the wiring GL_1 is divided into a wiring GL_1A and a wiring GL_1B, has a configuration in which the transistor 117, the transistor 118, the transistor 121, and the added transistor 127 are controlled with different signals. Such a configuration enables the signals retained in the plurality of memory circuits to be selected and used for superimposition of images.

Figure 9A:
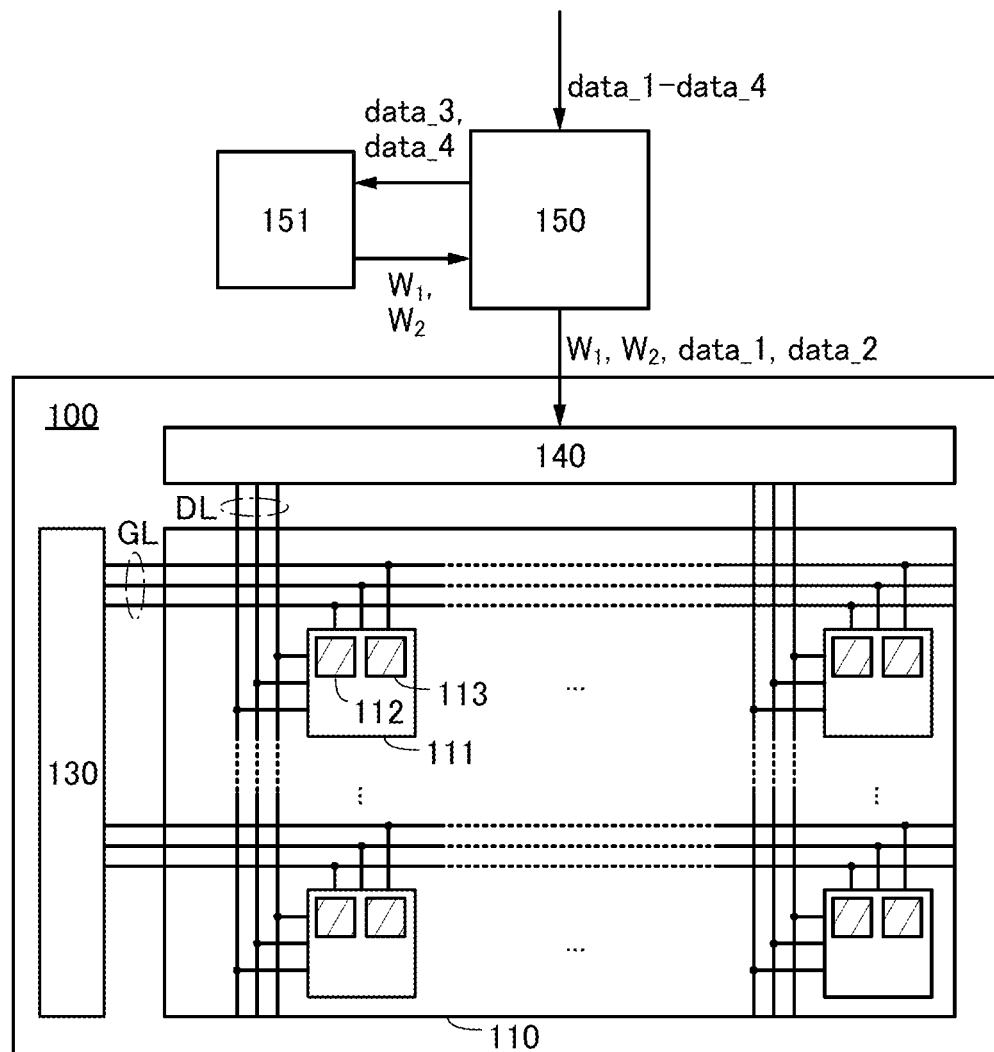
FIGS. 9A to 9C Block diagrams showing configuration examples of a display device.

FIG. 9(A) illustrates a signal conversion circuit 150 and a memory circuit 151 in addition to the configuration of the block diagram illustrated in FIG. 1(A).

In the case where the display device 100 displays superimposed images, a configuration is preferable in which the signals $W_1$ and $W_2$ for being retained in the memory circuits 112 and 113 in the pixel 111 are converted by the signal conversion circuit 150 with reference to the memory circuit 151 and the converted signals are output to the display device 100.

Figure 9B:
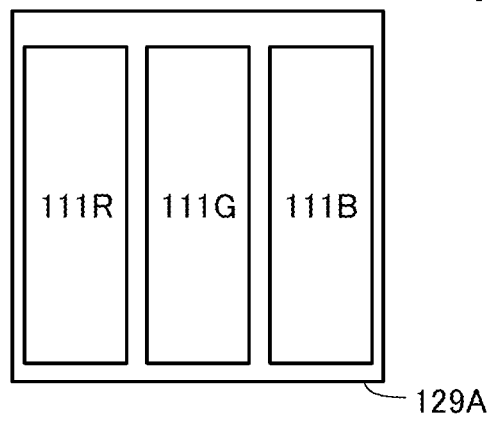
Figure 9C:
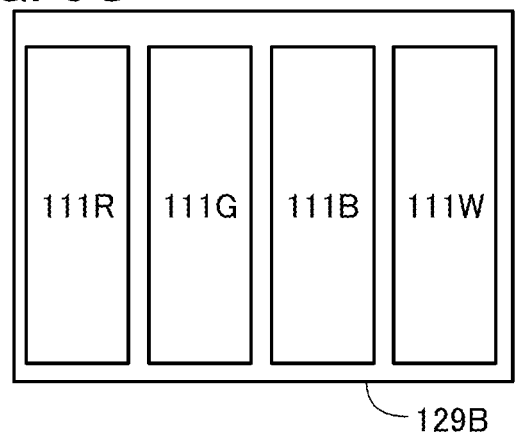

Although the pixel 111 is described above, in the case of performing color display, the pixel 111 corresponds to each of three subpixels 111R, 111G, and 111B of the three primary colors of R, G, and B (red, green, and blue) and a plurality of subpixels are combined to configure one pixel, as illustrated in FIG. 9(B). Note that the number of subpixels is not limited to the three of R, G, and B illustrated in FIG. 9(B), and it is also effective to combine subpixels 111R, 111G, 111B, and 111W of R, G, B, and W (red, green, blue, and white) to configure one pixel, as illustrated in FIG. 9(C).

This embodiment can be implemented in appropriate combination with any of the structures described in the other embodiments and the like.

Embodiment 2

In this embodiment, a structure example of a display device which is different from that described in Embodiment 1 will be described with reference to drawings. In this embodiment, different points from Embodiment 1 are described in detail, and overlapping description is omitted in some cases.

Figure 10:
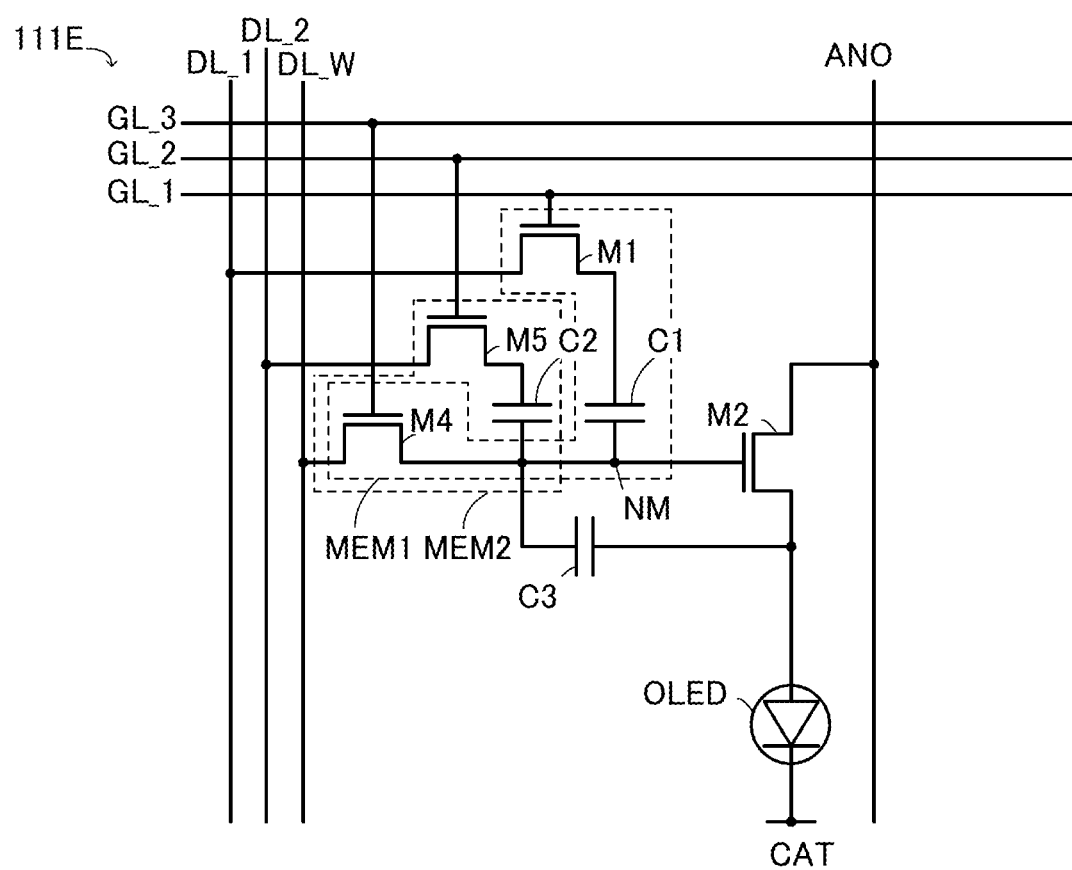
FIG. 10 A circuit diagram showing a configuration example of a display device.

FIG. 10 illustrates a configuration example of a pixel 111E that can be used as the pixel 111 in FIG. 1(A). The pixel 111E includes a transistor M1, a transistor M2, a transistor M4, a transistor M5, a capacitor C1, a capacitor C2, a capacitor C3, and a light-emitting element OLED. In FIG. 10, a node to which a gate of the transistor M2 is connected is illustrated as a node NM. Note that the transistors illustrated in FIG. 10 are all n-channel transistors, but p-channel transistors can also be used.

The transistor M2 has a function of controlling the amount of current flowing through the light-emitting element OLED. The transistors other than the transistor M2 each have a function as a switch. A memory circuit MEM1 includes a capacitor C1, a transistor M1, and a transistor M4. A memory circuit MEM2 includes a capacitor C2, a transistor M4, and a transistor M5.

In FIG. 10, a wiring GL_1, a wiring GL_2, and a wiring GL_3 are illustrated as the wirings GL illustrated in FIG. 1(A). Each of the wiring GL_1, the wiring GL_2, and the wiring GL_3 has a function of transmitting a signal for controlling the on/off of a transistor functioning as a switch to the pixel 111E.

In FIG. 10, a wiring DL_1, a wiring DL_2, and a wiring DL_W are illustrated as the wirings DL illustrated in FIG. 1(A). Each of the wiring DL_1 and the wiring DL_2 has a function of transmitting a signal for performing image display and a reference voltage to the pixel 111E. The wiring DL_W has a function of transmitting a signal for performing image display to the pixel 111E.

The capacitor C1 or the capacitor C2 has a function of retaining a signal to be written to the memory circuit MEM1 or the memory circuit MEM2 as charges. The transistor M1, the transistor M4, and the transistor M5, which are electrically connected to one electrode or the other electrode of the capacitor C1 or the capacitor C2, have a function of supplying charges corresponding to a signal to the electrode of the capacitor C1 or the capacitor C2 when being turned on. The transistor M1, the transistor M4, and the transistor M5 have a function of retaining charges in the electrode of the capacitor C1 or the capacitor C2 when being turned off. The transistor M1, the transistor M4, and the transistor M5 have a function of setting a node of the one electrode of the capacitor C1 or the capacitor C2 to an electrically floating state (floating).

As illustrated in FIG. 10, the one electrode of the capacitor C1 is connected to the wiring DL_1 through the transistor M1. The other electrode of the capacitor C1 is connected to the wiring DL_W through the transistor M4. The one electrode of the capacitor C2 is connected to the wiring DL_2 through the transistor M5. The other electrode of the capacitor C2 is connected to the wiring DL_W through the transistor M4.

Current flowing through the transistor M1, the transistor M4, and the transistor M5 when the transistors are off (off-state current) is preferably low. The use of transistors with a noticeably low off-state current allows the potential of the node NM to be retained for a long time. As the transistors, OS transistors can be used, for example.

The capacitor C3 has a function of retaining voltage between the gate and a source of the transistor M2. One electrode of the capacitor C3 is connected to the gate of the transistor M2. The other electrode of the capacitor C3 is connected to one electrode of a source and a drain (the source side) of the transistor M2. The other of the source and the drain (the drain side) of the transistor M2 is connected to a wiring ANO. The wiring ANO is supplied with a voltage for feeding current to the light-emitting element OLED. The wiring ANO has a function as a current supply line or an anode line. Note that it is preferable to provide a transistor functioning as a switch between the one of the source and the drain of the transistor M2 and a wiring supplied with a fixed potential. With such a structure, the potential of the one of the source and the drain of the transistor M2 can be prevented from changing in a signal writing period.

The one electrode of the light-emitting element OLED is connected to the one of the source and the drain (the source side) of the transistor M2. The other electrode of the light-emitting element OLED is connected to a wiring CAT. The wiring CAT has a function as a common potential line or a cathode line. Note that the light-emitting element OLED is a display element whose luminance can be controlled in accordance with the amount of flowing current, and for example, an organic EL element can be used. Note that a transistor functioning as a switch is preferably provided between one of the source and the drain of the transistor M2 and the one electrode of the light-emitting element OLED, in order to prevent current from flowing through the light-emitting element OLED and light emission in a period other than a non-emission period. Note that as a display element other than a light-emitting element such as an organic EL element, a liquid crystal element can also be used.

In one embodiment of the present invention, signals for displaying gray scale output from the source driver 140 are supplied to pixels and retained in a plurality of memory circuits, and signals for displaying gray scale which are different from the signals retained in the plurality of memory circuits are supplied from the source driver 140 to the pixels. In FIG. 10, signals for displaying gray scale output from the source driver 140 are retained in the two memory circuits, and signals for displaying gray scale are supplied from the source driver 140 to the pixels through the wiring DL_1 and the wiring DL_2.

With this structure, on the basis of the four signals, which are two signals retained in the memory circuits in advance and other two signals supplied thereto, current flowing through a light-emitting element can be controlled. Therefore, on a display portion including the pixel, display based on the four signals can be performed. Thus, a signal with the number of bits that can be output from the source driver (e.g., 8 bits: 256 gray-scale levels) can be retained in each of two memory circuits in a pixel; in addition, a signal with the number of bits that can be output from the source driver (e.g., 8 bits: 256 gray-scale levels) can be written to the pixel as each of the two signals to be written to the pixel. Accordingly, display can be performed using signals with the total number of gray-scale levels of the four signals, 256+256+256+256=1024 levels (10 bit), that is, gray-scale levels greater than or equal to the number of bits that can be output from the source driver. With this structure, an image corresponding to an image signal whose potential is higher than a potential that can be generated by a source driver or the like can be displayed on the display device, so that the dynamic range of the display device can be increased.

An example of a driving method of the pixel 111E is described with reference to timing charts illustrated in FIGS. 11(A) and 11(B) and circuit diagrams illustrated in FIGS. 12(A) to 12(D). FIG. 11(A) illustrates an operation of writing signals retained in the memory circuit MEM1 and the memory circuit MEM2, and FIG. 11(B) illustrates an operation of displaying images by adding other signals to the signals retained in the memory circuit MEM1 and the memory circuit MEM2. Note that in the timing charts in FIGS. 11(A) and 11(B), the waveforms of signals supplied to the wirings GL_1 to GL_3, DL_1, DL_2, and DL_W are illustrated.

Note that signals supplied to the wiring DL_W are referred to as W1 and W2, and voltage retained in the memory circuit MEM1 in accordance with the signal is referred to as Vw1, and voltage retained in the memory circuit MEM2 in accordance with the signal is referred to as Vw2. A signal written to the pixel 111E through the wiring DL_1 with the voltage Vw1 retained in the memory circuit MEM1 is data1, and a voltage applied to the memory circuit MEM1 by the signal is Vdata1. A signal written to the pixel 111E through the wiring DL_2 with the voltage Vw2 retained in the memory circuit MEM2 is data2, and a voltage applied to the memory circuit MEM2 by the signal is Vdata2.

Figure 12A:
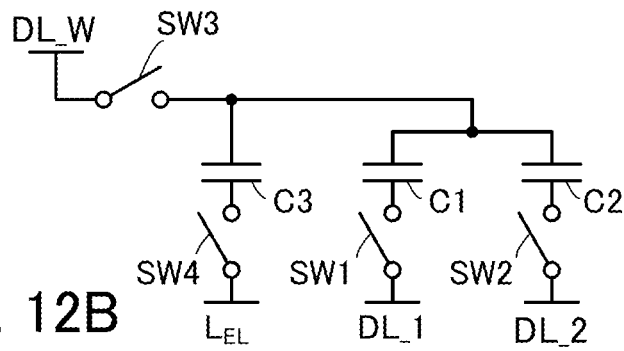
FIGS. 12A to 12D Circuit diagrams showing configuration examples of a display device.

First, writing operation of the signals W1 and W2 to be retained in the memory circuit MEM1 and the memory circuit MEM2 will be described with reference to FIG. 11(A). For simplifying the description of the operation in FIGS. 11(A) and 11(B), description is made using circuit diagrams in FIGS. 12(A) to 12(D) as a reference. FIGS. 12(A) to 12(D) show a main part in the circuit diagram in FIG. 10. FIG. 12(A) illustrates the switches SW1 to SW4 as transistors functioning as switches and the capacitors C1, C2, and C3 which correspond to the structure illustrated in FIG. 10. Note that the capacitances of the capacitors C1, C2, and C3 are denoted as $C_1$, $C_2$, and $C_3$. The switches SW1 to SW3 correspond to the transistor M1, the transistor M4, and the transistor M5 in FIG. 10. The switch SW4 is a switch for suppressing change in a potential of one of the source and the drain of the transistor M2 when a signal is written. The switch SW4 is a switch that is turned on when a signal is written. A wiring $L_{EL}$ connected to the switch SW4 is a wiring for supplying a fixed potential Vel.

Figure 12B:
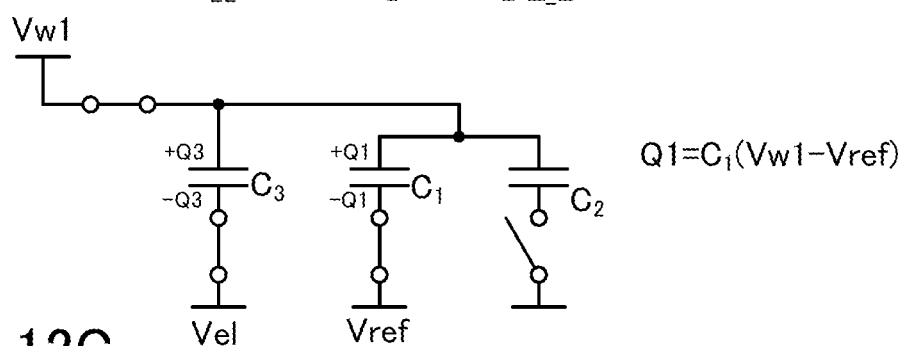

In the case where the voltages Vw1 and Vw2 based on the signals $W_1$ and $W_2$ are written to the memory circuit MEM1 and the memory circuit MEM2, first, the wiring DL_W is set to the voltage Vw1, and the wiring DL_1 is set to Vref (reference voltage). The potential of the wiring DL_2 is not particularly determined. Note that the value of Vref supplied to the wiring DL_1 is preferably determined in advance so that Vw1−Vref has a positive value. The signals supplied to the wiring GL_1 and the wiring GL_3 are each set to an H level in a state where the potential of each wiring is set to a predetermined voltage as in Time T1 in FIG. 11(A). That is, the switches SW1, SW3, and SW4 are turned on as illustrated in FIG. 12(B). Then, the voltages Vref and Vw1 are applied to the electrodes on both ends of the capacitor C1. At this time, Equation (9) can be obtained when the amount of charge accumulated in the electrode of the capacitor C1 on the node NM side is represented by Q1.

$$Q1 = C_1(Vw1 - Vref) \quad (9)$$

Figure 12C:
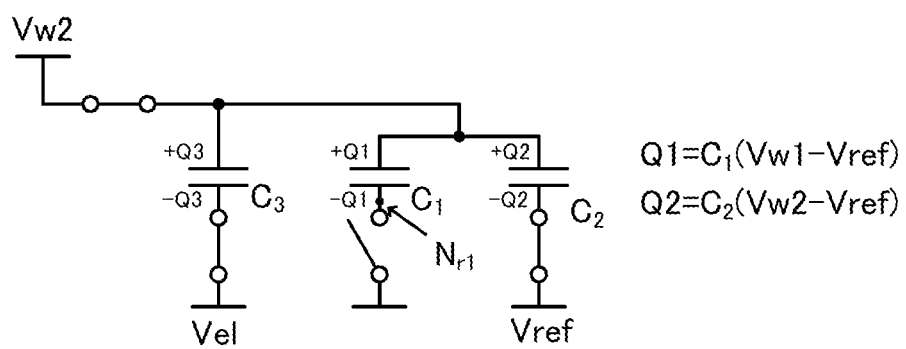

Next, the wiring DL_W is set to the voltage Vw2, and the wiring DL_2 is set to Vref. The potential of the wiring DL_1 is not particularly determined. Note that the value of Vref supplied to the wiring DL_2 is preferably determined in advance so that Vw2−Vref has a positive value. The signals supplied to the wiring GL_2 and the wiring GL_3 are each set to an H level in a state where the potential of each wiring is set to a predetermined voltage as in Time T2 in FIG. 11(A). That is, the switches SW2, SW3, and SW4 are turned on as illustrated in FIG. 12(C). Then, the voltages Vref and Vw2 are applied to the electrodes on both ends of the capacitor C2. At this time, Equation (10) can be obtained when the amount of charge accumulated in the electrode of the capacitor C2 on the node NM side is represented by Q2.

$$Q2 = C_2(Vw2 - Vref) \quad (10)$$

At Time T2, that is, in the state of FIG. 12(C), the switch SW1 is off. Thus, a node of one electrode of the capacitor C1 (a node $N_{r1}$ in FIG. 12(C)) is in an electrically floating state and the principle of charge conservation is established. Therefore, at Time T2, that is, in the state of FIG. 12(C), the charge amount Q1 retained in both of the electrodes of the capacitor C2 is kept retained as in Equation (9).

Note that the signals W1 and W2 at Time T1 and Time T2 shown in FIG. 11(A) may be written separately in every frame period or a single value may be written in one horizontal scanning period.

Next, an operation of adding the signals data1 and data2 to the pixel 111E through the wirings DL_1 and DL_2 in a state where the voltage Vw1 and the voltage Vw2 based on the signals $W_1$ and $W_2$ are retained in the memory circuit MEM1 and the memory circuit MEM2 is described with reference to FIG. 11(B).

Figure 12D:
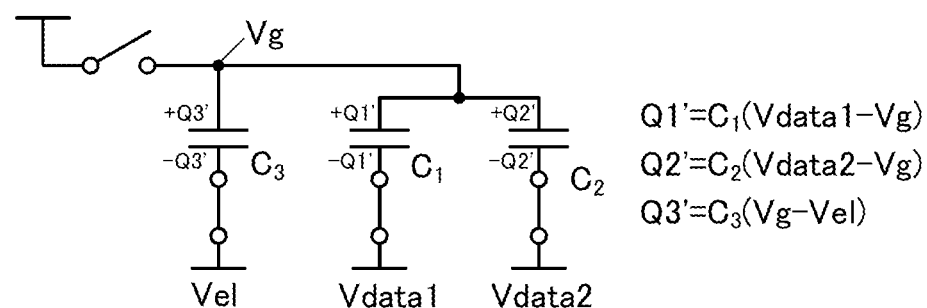

In the case where the signals data1 and data2 are written to the memory circuit MEM1 and the memory circuit MEM2, signals supplied to the wiring GL_1 and the wiring GL_2 are set to an H level and a signal supplied to the wiring GL_3 is set to an L level in a state where the wiring DL_1 is Vdata1, the wiring DL_2 is Vdata2, and the wiring DL_W is an L level such as VSS. That is, the switches SW1, SW2, and SW4 are turned on and the switch SW3 is turned off, as illustrated in FIG. 12(D). Then, the one electrodes of the capacitors C1, C2, and C3 are each brought into an electrically floating state, and the voltages of the other electrodes of the capacitors C1 and C2 changes from Vw1 and Vw2 to Vdata1 and Vdata2, respectively. At this time, Equation (11) can be obtained when the voltage of the node NM is Vg and the amount of charge accumulated in the electrode of the capacitor C1 on the node NM side is Q1'. Vg is a voltage that changes by capacitive coupling.

$$Q1' = C_1(Vdata1 - Vg) \quad (11)$$

Similarly, at this time, when the amount of charge accumulated in the electrodes on the node NM side of the capacitor C2 and the capacitor C3 are denoted as Q2' and Q3', Equation (12) and Equation (13) are established.

$$Q2' = C_2(Vdata2 - Vg) \quad (12)$$

$$Q3' = C_3(Vg - Vel) \quad (13)$$

In the node NM during the operations in FIGS. 11(A) and 11(B), the switches SW1 to SW4 have an extremely low off-state current, the principle of charge conservation is established. That is, Equation (7) is satisfied.

$$Q1 + Q2 + Q3 = Q1' + Q2' + Q3' \quad (7)$$

When Equation (7) is solved for Vg, Equation (14) is satisfied. Note that for simplicity in Equation (14), the reference voltages Vref and Vel with respect to the voltages Vw1, Vw2, Vdata1, and Vdata2 are each set to 0 V, the capacitance $C_1$ is equal to the capacitance $C_2$, and the capacitance $C_3$ is set adequately smaller than each of the capacitances $C_1$ and $C_2$.

[Formula 2]

According to Equation (14), the voltage Vg can be obtained by adding up a voltage Vw1, a voltage Vw2, the voltage Vdata1, and the voltage Vdata2; therefore, addition of the signals retained in the memory circuits and signals to be written later can be performed. Note that when signals are written such that the voltage Vw1, the voltage Vw2, the voltage Vdata1, and the voltage Vdata2 have negative values, subtraction of signals as well as addition of signals can be performed.

The display device of one embodiment of the present invention can control current flowing through the light-emitting element on the basis of four signals at the maximum by using the signals W1 and W2 retained in the memory circuits and the signals data1 and data2 to be subsequently written. Therefore, on a display portion including the pixel, display based on the four signals can be performed. Thus, a signal with the number of bits that can be output from the source driver (e.g., 8 bits: 256 gray-scale levels) can be retained in each of two memory circuits in a pixel; in addition, a signal with the number of bits that can be output from the source driver (e.g., 8 bits: 256 gray-scale levels) can be written to the pixel as each of the two signals to be written to the pixel. Accordingly, display can be performed using signals with the total number of gray-scale levels of the four signals, 256+256+256+256=1024 levels (10 bit), that is, gray-scale levels greater than or equal to the number of bits that can be output from the source driver. With this structure, an image corresponding to an image signal whose potential is higher than a potential that can be generated by a source driver or the like can be displayed on the display device, so that the dynamic range of the display device can be increased.

Figure 13:
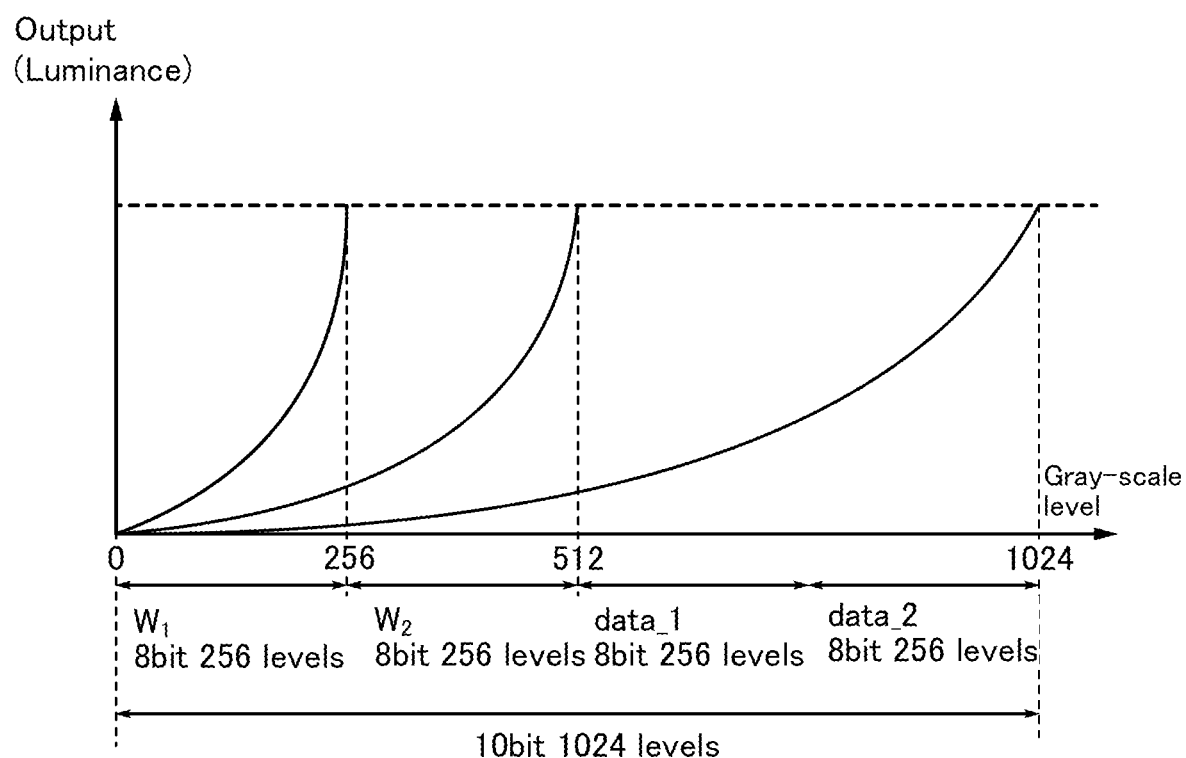
FIG. 13 A diagram showing an operation example of a display device.

The effects of the above-described display device of one embodiment of the present invention will be described with reference to the graph in FIG. 13. In the graph shown in FIG. 13, the horizontal axis represents the gray-scale level and the vertical axis represents output, specifically, the luminance of the light-emitting element.

As described above, with the structure of one embodiment of the present invention, current flowing through the light-emitting element can be controlled on the basis of four signals at the maximum. For example, when the signal $W_1$ is written with 8 bits that is the number of bits capable of being output by the source driver, the signal $W_1$ alone can express only 256-level gray scale; however, when the signal $W_1$ is combined with 8-bit signals capable of being output by the source driver, such as the signals W2, data1, and data2, to increase the number of gray-scale levels, display with 1024 gray-scale levels at the maximum, that is, display with the number of bits corresponding to 10 bits can be performed.

Next, a modification example of the pixel 111E is described. The pixel 111E can have a configuration of a pixel 111F illustrated in FIG. 14(A). The pixel 111F has a structure in which transistors M3 and M6 are added to the pixel 111E.

The transistors M3 and M6 each have a function as a switch for controlling electrical continuity between the wiring VL and the one of the source and the drain (the source side) of the transistor M2. A gate of the transistor M3 is connected to the wiring GL_1. One of a source and a drain of the transistor M3 is connected to the one of the source and the drain of the transistor M2. The other of the source and the drain of the transistor M3 is connected to the wiring VL. A gate of the transistor M6 is connected to the wiring GL_2. One of a source and a drain of the transistor M6 is connected to one of a source and a drain of the transistor M2. The other of the source and the drain of the transistor M6 is connected to the wiring VL. Note that the wiring VL is a wiring for supplying a fixed potential, for example, the above-described voltage Vel. The wiring VL may be configured to have a function of outputting current flowing through the transistor M2 to the outside. With such a configuration, the current flowing through the transistor M2 can be monitored periodically, so that correction in accordance with variation of the transistor M2 can be performed.

Figure 14A:
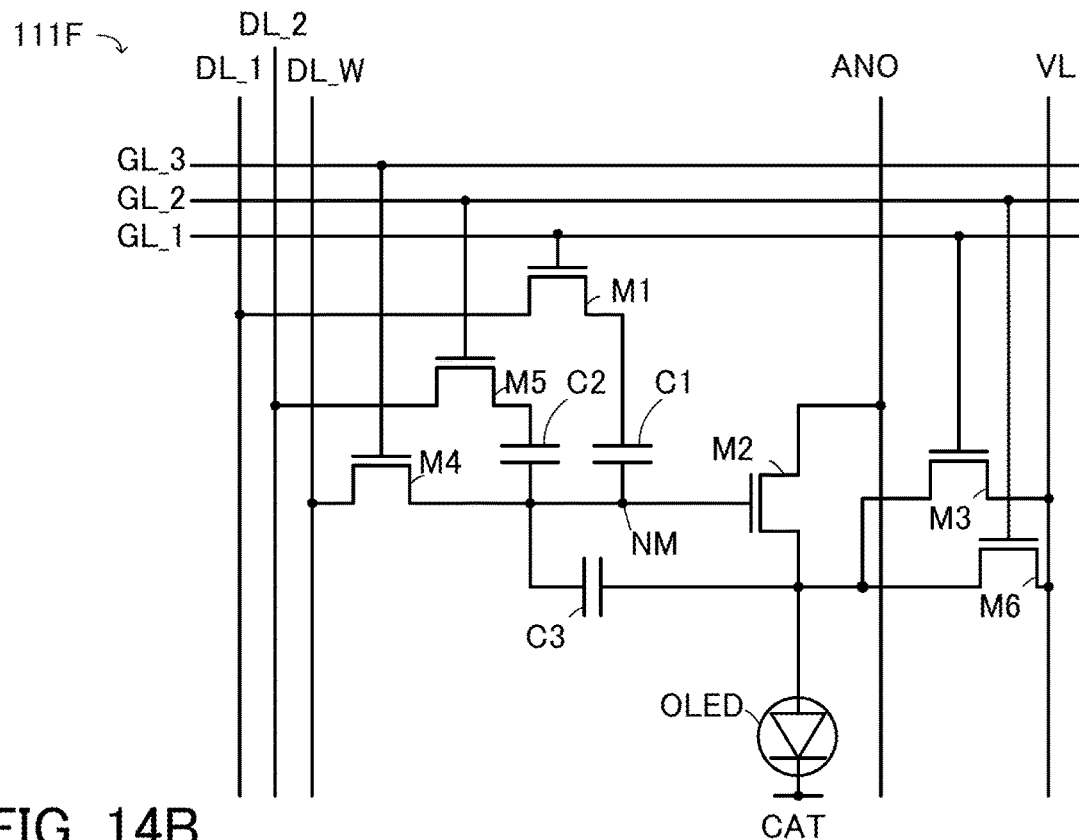
FIGS. 14A and 14B Diagrams showing configuration examples of a display device.
Figure 14B:
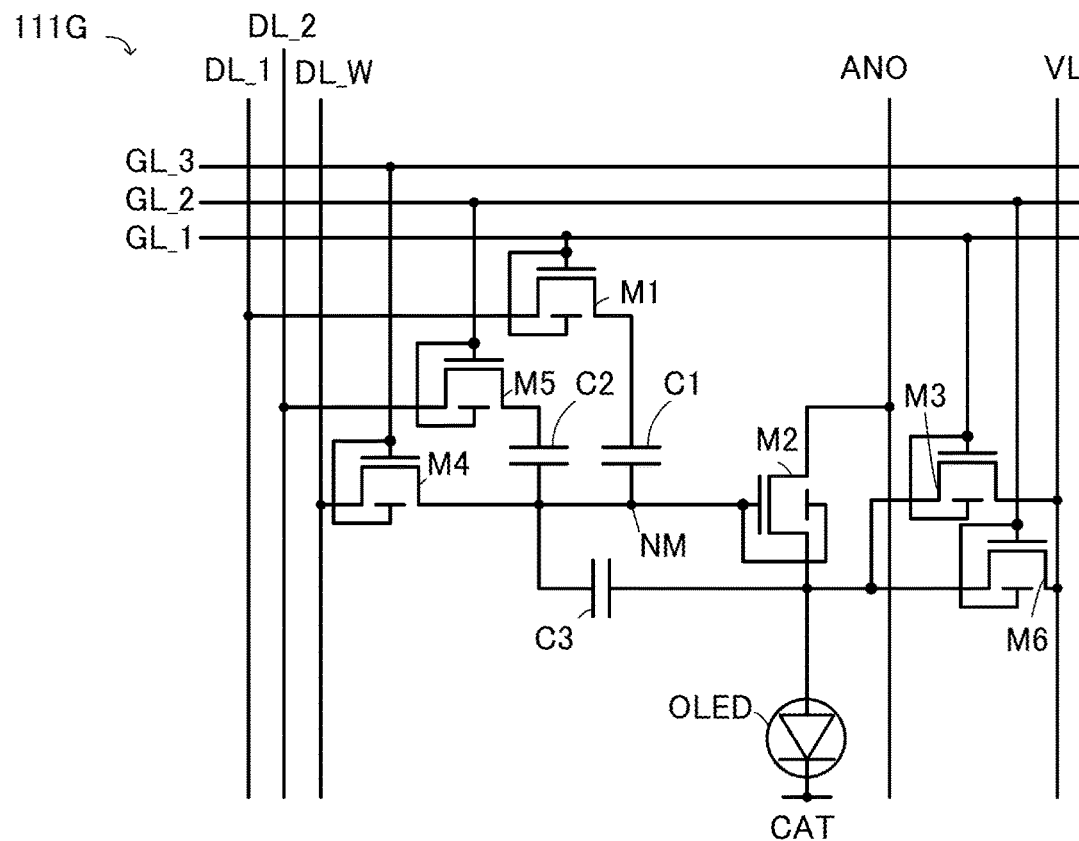

Alternatively, the pixel 111F illustrated in FIG. 14(A) can also have a configuration of a pixel 111G illustrated in FIG. 14(B). The pixel 111G has a configuration in which each transistor in the pixel 111F illustrated in FIG. 14(A) is provided with a back gate. The back gate is electrically connected to a front gate and has an effect of increasing on-state current. Alternatively, a configuration may be employed in which a fixed potential which is different from that of the front gate can be supplied to the back gate. Such a configuration enables control of the threshold voltage of the transistor. Note that although FIG. 14(B) illustrates a configuration in which all of the transistors are provided with a back gate, a transistor not provided with a back gate may also be included.

This embodiment can be implemented in appropriate combination with any of the structures described in the other embodiments and the like.

Embodiment 3

In this embodiment, details of the OS transistor described in Embodiments 1 and 2 will be described.

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that highly requires reliability, and the like. A CAC-OS has high mobility and is suitable for a transistor that operates at high speed, and the like.

An OS transistor has a large energy gap and thus has an extremely low off-state current. An OS transistor has features such that impact ionization, an avalanche breakdown, a short-channel effect, or the like does not occur, which are different from those of a Si transistor. Thus, the use of an OS transistor enables formation of a highly reliable circuit.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used to form a film of the In-M-Zn oxide satisfy In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

An oxide semiconductor with low carrier density is used for the semiconductor layer. For example, the semiconductor layer may use an oxide semiconductor whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. Therefore, since the impurity concentration is low and the density of defect states is low, the oxide semiconductor can be said to have stable characteristics.

Note that, without limitation to those described above, a material with an appropriate composition may be used in accordance with required semiconductor characteristics and electrical characteristics (e.g., field-effect mobility and threshold voltage) of a transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is an element belonging to Group 14, is contained in the oxide semiconductor contained in the semiconductor layer, the amount of oxygen vacancies is increased in the semiconductor layer, and the semiconductor layer becomes n-type. Thus, the concentration of silicon or carbon (measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (measured by secondary ion mass spectrometry) is preferably set to lower than or equal to $5\times10^{18}$ atoms/cm$^3$.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. In another example, an oxide film having an amorphous structure has an absolutely amorphous structure and no crystal part.

Note that the semiconductor layer may be a mixed film including two or more of a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

Described below is the composition of a CAC (Cloud-Aligned Composite)-OS, which is one embodiment of a non-single-crystal semiconductor layer.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)) to form a mosaic pattern, and InO$_{X1}$ or In$_{X2}$Zn$_{Y2}$O$_{Z2}$ forming the mosaic pattern is evenly distributed in the film.

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is intentionally not heated, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found by the X-ray diffraction that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has a region with high luminance in a ring pattern and a plurality of bright spots appear in the ring pattern. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when regions containing $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region containing $GaO_{X3}$ or the like as a main component is more excellent than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element using a CAC-OS has high reliability. Thus, the CAC-OS is suitably used as a material in a variety of semiconductor devices.

This embodiment can be implemented in appropriate combination with any of the structures described in the other embodiments and the like.

Embodiment 4

In this embodiment, structure examples of a display device including an EL element will be described.

Figure 15A:
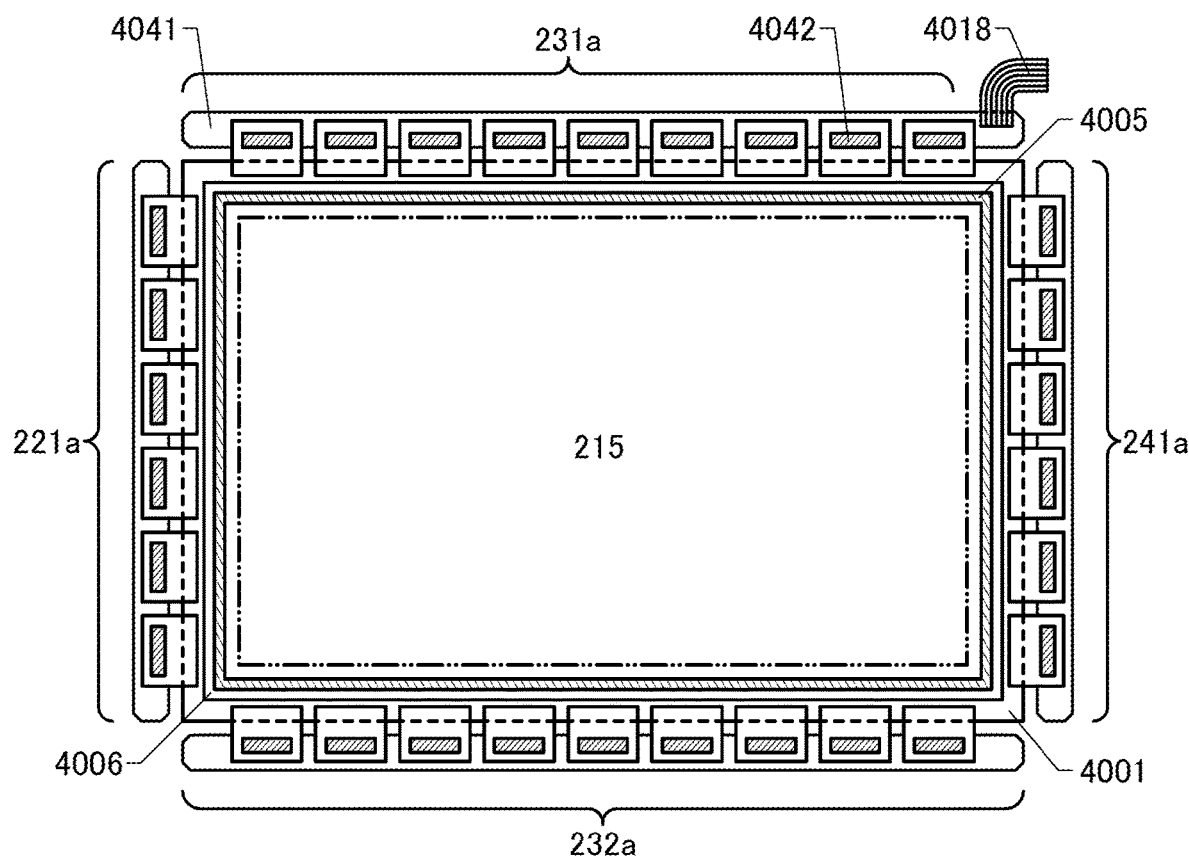
FIGS. 15A and 15B Diagrams showing configuration examples of a display device.

In FIG. 15(A), a sealant 4005 is provided to surround a display portion 215 provided over a first substrate 4001, and the display portion 215 is sealed with the sealant 4005 and a second substrate 4006.

A pixel array including the pixels described in Embodiment 1 is provided in the display portion 215.

Note that the number of pixels provided in the pixel array is preferably 3840×2160 or 7680×4320, in which case ultra high definition ("4K resolution", "4K2K", or "4K") or super high definition ("8K resolution", "8K4K", or "8K") images can be displayed. With such a configuration, a high-resolution images can be seen on a large-sized display device.

In the case of a configuration for displaying 8K4K images or 4K2K images, it is preferable that driver circuits be disposed on both of the sides of a pixel array and the number of wirings such as scan lines and signal lines be increased. With such a configuration, malfunctions such as signal delay and voltage drop, which are caused by an increase in wiring resistance due to an increase in the number of pixels, can be reduced.

In FIG. 15(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a each have a function as a source driver. The scan line driver circuit 221a has a function as the gate driver described in the above embodiment. The common line driver circuit 241a has a function of supplying a predetermined potential to the common wiring.

Signals and potentials are supplied to the scan line driver circuit 221a, the common line driver circuit 241a, the signal line driver circuit 231a, and the signal line driver circuit 232a through an FPC (FPC: Flexible Printed Circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying an image signal to the display portion 215. The integrated circuits 4042 are mounted in a region different from a region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

Figure 15B:
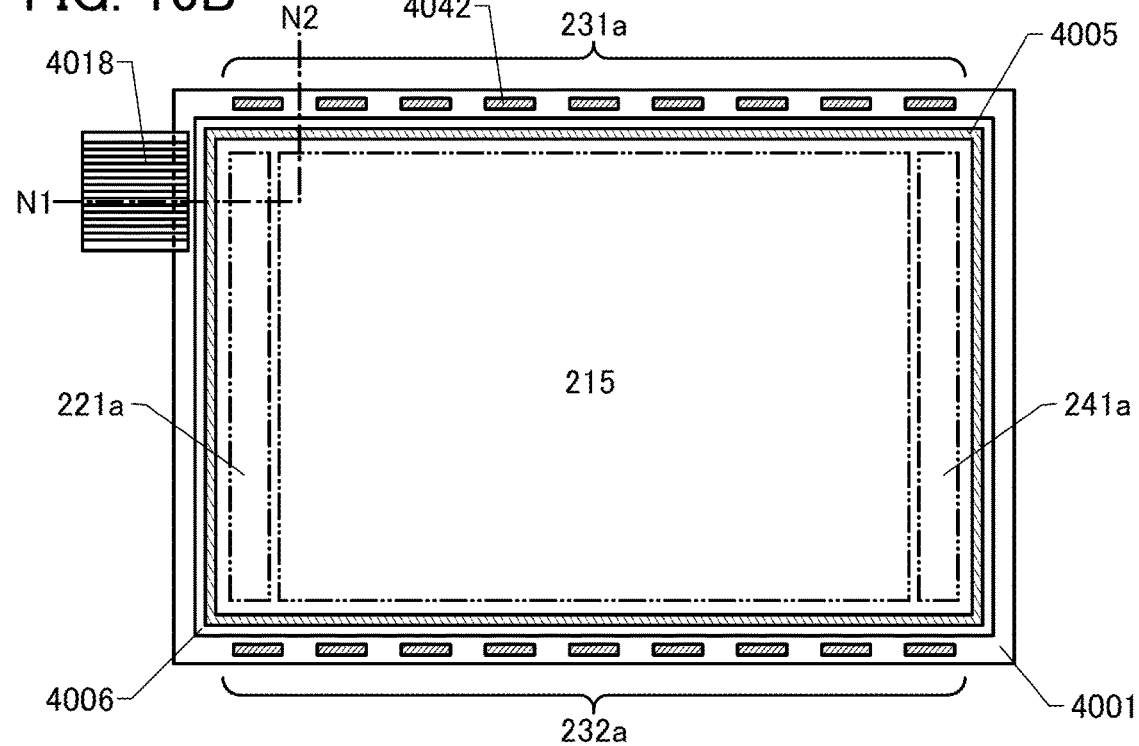

FIG. 15(B) shows an example of mounting the integrated circuits 4042 included in the signal line driver circuit 231a and the signal line driver circuit 232a by a COG method. Some or all of the driver circuits can be formed over a substrate over which the display portion 215 is formed, whereby a system-on-panel can be obtained.

In the example shown in FIG. 15(B), the scan line driver circuit 221a and the common line driver circuit 241a are formed over the substrate over which the display portion 215 is formed. When the driver circuits are formed concurrently with the pixel circuit in the display portion 215, the number of components can be reduced. Accordingly, the productivity can be increased.

In FIG. 15(B), the sealant 4005 is provided to surround the display portion 215, the scan line driver circuit 221a, and the common line driver circuit 241a over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element with the use of the first substrate 4001, the sealant 4005, and the second substrate 4006.

Although the signal line driver circuit 231a and the signal line driver circuit 232a are formed separately and mounted on the first substrate 4001 in the example shown in FIG. 15(B), one embodiment of the present invention is not limited to this structure. The scan line driver circuits may be separately formed and then mounted, or part of the signal line driver circuits or part of the scan line driver circuits may be separately formed and then mounted.

In some cases, the display device encompasses a panel in which a display element is sealed, and a module in which an IC or the like including a controller is mounted on the panel.

The display portion and the scan line driver circuit over the first substrate each include a plurality of transistors. Any of the transistors described in the above embodiment can be used as the transistors.

Transistors included in the peripheral driver circuits and transistors included in the pixel circuits of the display portion may have the same structure or different structures. The transistors included in the peripheral driver circuits may have the same structure or a combination of two or more kinds of structures. Similarly, the transistors included in the pixel circuits may have the same structure or a combination of two or more kinds of structures.

An input device 4200 can be provided over the second substrate 4006, as illustrated in FIG. 16. The display devices illustrated in FIGS. 15(A) and 15(B) provided with the input device 4200 can function as a touch panel.

There is no particular limitation on a detection element (also referred to as a sensor element) included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 16A:
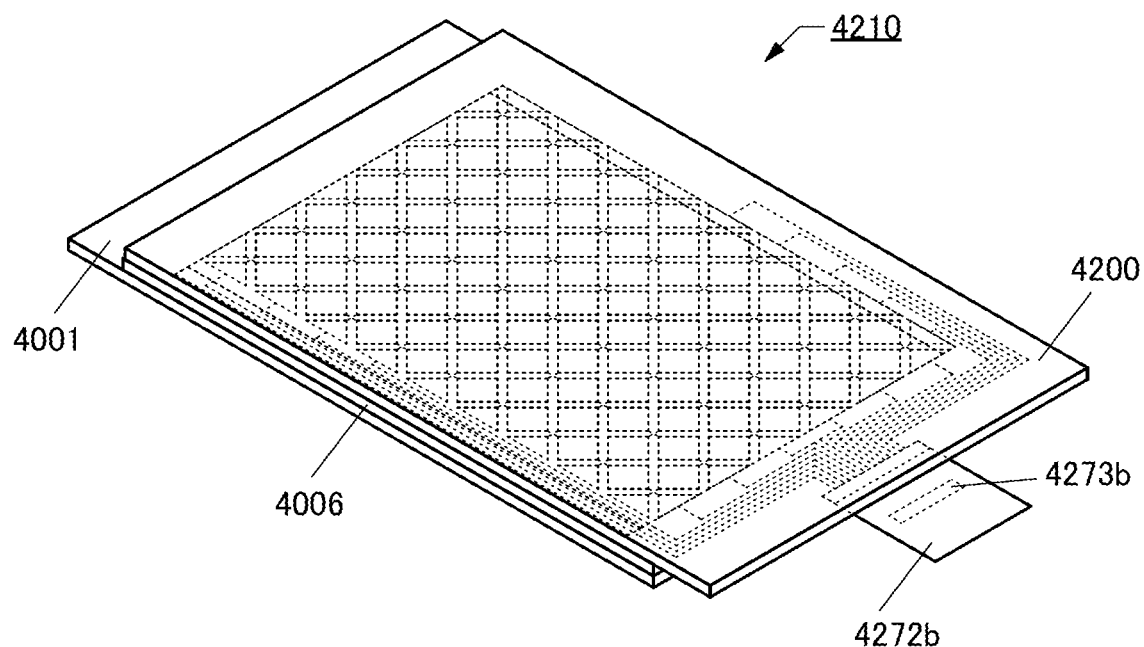
FIGS. 16A and 16B Diagrams showing structure examples of a touch panel.
Figure 16B:
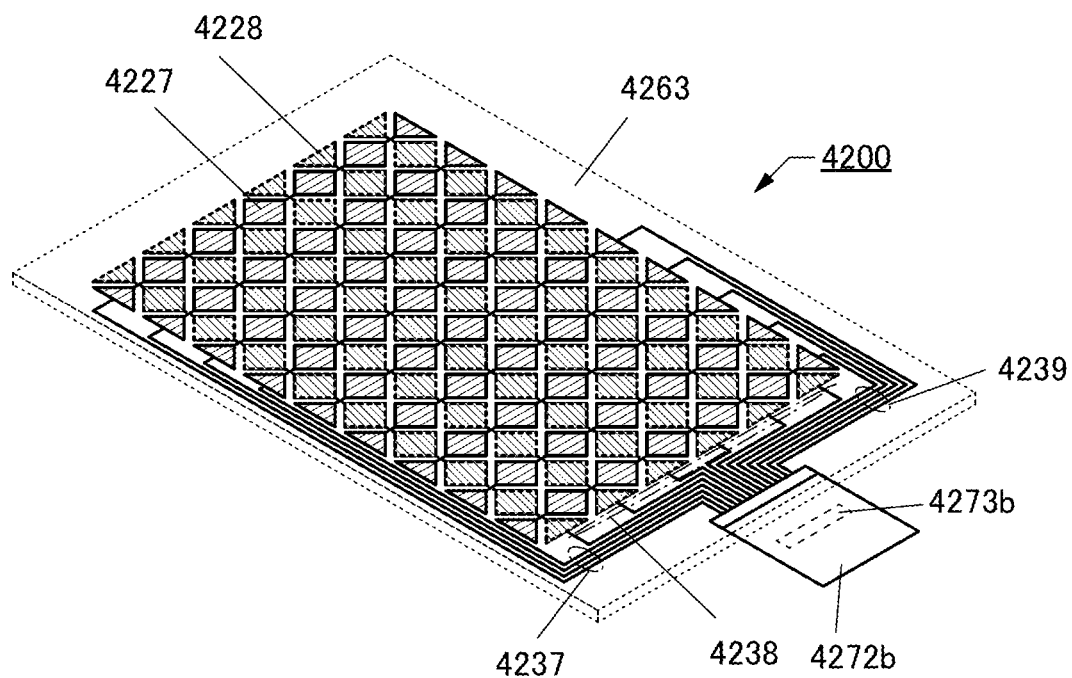

FIGS. 16(A) and 16(B) illustrate an example of the touch panel. FIG. 16(A) is a perspective view of a touch panel 4210. FIG. 16(B) is a schematic perspective view of the input device 4200. Note that for simplicity, only the major components are illustrated.

The touch panel 4210 has a structure in which a display device and a sensor element that are formed separately are bonded together.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

Furthermore, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

Figure 17:
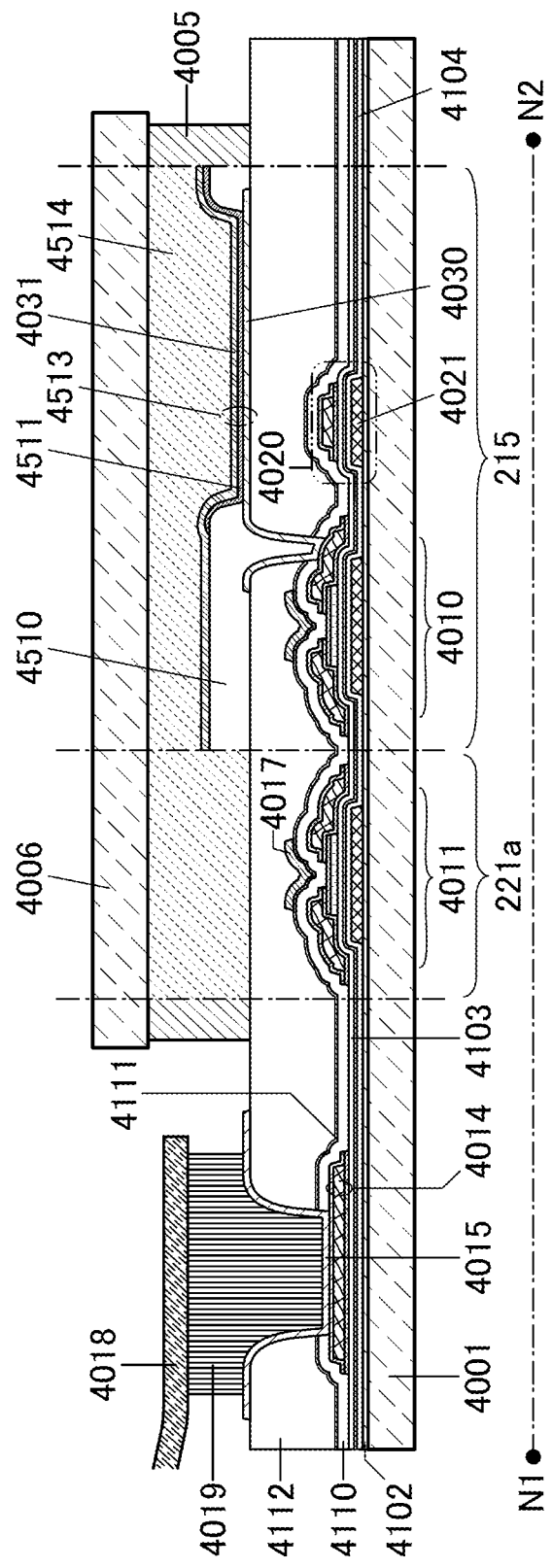
FIG. 17 A Diagram showing a structure example of a display device.

FIG. 17 is a cross-sectional view taken along the chain line N1-N2 in FIG. 15(B). A display device shown in FIG. 17 includes an electrode 4015, and the electrode 4015 is electrically connected to a terminal included in the FPC 4018 through an anisotropic conductive layer 4019. In FIG. 17, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source and drain electrodes of transistors 4010 and 4011.

The display portion 215 and the scan line driver circuit 221a provided over the first substrate 4001 each include a plurality of transistors. In FIG. 17, the transistor 4010 included in the display portion 215 and the transistor 4011 included in the scan line driver circuit 221a are shown as an example. In the example shown in FIG. 17, the transistor 4010 and the transistor 4011 are bottom-gate transistors but may be top-gate transistors.

In FIG. 17, the insulating layer 4112 is provided over the transistor 4010 and the transistor 4011. A bank 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display device shown in FIG. 17 includes a capacitor 4020. The capacitor 4020 includes an electrode 4021 formed in the same step as a gate electrode of the transistor 4010, and an electrode formed in the same step as a source electrode and a drain electrode of the transistor 4010. Each of the electrodes of the capacitor 4020 overlap with each other with the insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor may be set considering the off-state current of the transistor or the like.

The transistor 4010 included in the display portion 215 is electrically connected to the display element.

The display device shown in FIG. 17 includes the insulating layer 4111 and an insulating layer 4104. As the insulating layer 4104 and the insulating layer 4111, insulating layers through which an impurity element does not easily pass are used. A semiconductor layer of the transistor is sandwiched between the insulating layer 4104 and the insulating layer 4111, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, and thus, the light-emitting organic compound is excited. The light-emitting organic compound returns to a ground state from the excited state, thereby emitting light. Owing to such a mechanism, such a light-emitting element is referred to as a current-excitation light-emitting element.

In addition to the light-emitting compound, the EL layer may further include any of a substance with an excellent hole-injection property, a substance with an excellent hole-transport property, a hole-blocking material, a substance with an excellent electron-transport property, a substance with an excellent electron-injection property, a substance with a bipolar property (a substance with an excellent electron- and hole-transport property), and the like.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. Here, the case will be described in which an organic EL element is used as a light-emitting element.

In order to extract light emitted from the light-emitting element, at least one of a pair of electrodes needs to be transparent. The transistor and the light-emitting element are formed over a substrate. The light-emitting element can have a top emission structure in which light emission is extracted from the side opposite to the substrate, a bottom emission structure in which light emission is extracted from the substrate side, or a dual emission structure in which light emission is extracted from both the side opposite to the substrate and the substrate side. Any emission structure of the light-emitting element can be employed.

FIG. 17 shows an example of a light-emitting display device using a light-emitting element as a display element (also referred to as an "EL display device"). A light-emitting element 4513 which is a display element is electrically connected to the transistor 4010 provided in the display portion 215. The structure of the light-emitting element 4513 is the layered structure of the first electrode layer 4030, a light-emitting layer 4511, and a second electrode layer 4031; however, this embodiment is not limited to this structure. The structure of the light-emitting element 4513 can be changed as appropriate depending on the direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 whose emission color is white is combined with a coloring layer and a method in which the light-emitting element 4513 with a different emission color is provided in each pixel. The former method is more productive than the latter method. The latter method, which requires separate formation of the light-emitting layer 4511 pixel by pixel, is less productive than the former method; however, the latter method can produce the emission color with higher color purity than that of the emission color produced by the former method. When the light-emitting element 4513 has a microcavity structure in the latter method, the color purity can be further increased.

The light-emitting layer 4511 may contain an inorganic compound such as quantum dots. For example, when used for the light-emitting layer, the quantum dots can serve as a light-emitting material.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In a space which is formed with the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member, which has high air-tightness and little degasification, so that the light-emitting element is not exposed to the outside air, in this manner.

As the filler 4514, an ultraviolet curable resin or a thermosetting resin can be used as well as an inert gas such as nitrogen or argon; for example, PVC (polyvinyl chloride), an acrylic resin, polyimide, an epoxy resin, a silicone resin, PVB (polyvinyl butyral), EVA (ethylene vinyl acetate), or the like can be used. A drying agent may be contained in the filler 4514.

A glass material such as a glass frit or a resin material such as a resin that is curable at room temperature (e.g., a two-component-mixture-type resin), a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also referred to as a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, or a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

This embodiment can be implemented in appropriate combination with any of the structures described in the other embodiments and the like.

Embodiment 5

In this embodiment, examples of transistors which can be used as the transistors described in the above embodiments will be described with reference to the drawings.

The display device of one embodiment of the present invention can be fabricated using a transistor with any of various structures, such as a bottom-gate transistor or a top-gate transistor. Therefore, a material for a semiconductor layer or the structure of a transistor can be easily changed depending on the existing production line.

[Bottom-Gate Transistor]

FIG. 18(A1) is a cross-sectional view of a channel-protective transistor 810 that is a type of bottom-gate transistor. In FIG. 18(A1), the transistor 810 is formed over a substrate 771. The transistor 810 includes an electrode 746 over the substrate 771 with an insulating layer 772 therebetween. The transistor 810 includes a semiconductor layer 742 over the electrode 746 with an insulating layer 726 therebetween. The electrode 746 can function as a gate electrode. The insulating layer 726 can function as a gate insulating layer.

Furthermore, tan insulating layer 741 is provided over a channel formation region in the semiconductor layer 742. Furthermore, an electrode 744a and an electrode 744b are provided to be partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. Note that the insulating layer 729 is not necessarily provided as needed.

A transistor 811 illustrated in FIG. 18(A2) is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a given potential. By changing the potential of the back gate electrode independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. The electrode 723 may be provided between the insulating layer 728 and the insulating layer 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 provided therebetween and setting the potentials of the electrode 746 and the electrode 723 to the same potential, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current with respect to its occupied area. That is, the area occupied by transistor 811 can be small for a required on-state current. According to one embodiment of the present invention, a display device with a reduced area occupied with transistors can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a display device with a transistor with high reliability can be provided.

FIG. 18(B1) is a cross-sectional view of a channel-protective transistor 820 that is a type of bottom-gate transistor. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can function as a channel protective layer.

A transistor 821 illustrated in FIG. 18(B2) is different from the transistor 820 in that the electrode 723 which can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The length between the electrode 744a and the electrode 746 and the length between the electrode 744b and the electrode 746 in the transistors 820 and 821 are larger than those in the transistors 810 and 811. Thus, the parasitic capacitances generated between the electrode 744a and the electrode 746 and between the electrode 744b and the electrode 746 can be made smaller. According to one embodiment of the present invention, a transistor with favorable electrical characteristics can be provided.

A transistor 825 illustrated in FIG. 18(C1) is a channel-etched transistor that is a type of bottom-gate transistor. In the transistor 825, the electrode 744a and the electrode 744b are formed without providing the insulating layer 741. Thus, part of the semiconductor layer 742 that is exposed at the time of forming the electrode 744a and the electrode 744b is etched in some cases. However, since the insulating layer 741 is not provided, the productivity of the transistor can be increased.

A transistor 826 illustrated in FIG. 18(C2) is different from the transistor 825 in that the electrode 723 which can function as a back gate electrode is provided over the insulating layer 729.

[Top-Gate Transistor]

A transistor 842 illustrated in FIG. 19(A1) is a type of top-gate transistor. The electrode 744a and the electrode 744b are electrically connected to the semiconductor layer 742 through openings formed in the insulating layer 728 and the insulating layer 729.

Furthermore, part of the insulating layer 726 that does not overlap with the electrode 746 is removed, and an impurity 755 is introduced into the semiconductor layer 742 using the electrode 746 and the residual insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. Thus, an LDD (Lightly Doped Drain) region is formed in a region of the semiconductor layer 742 which does not overlap with the electrode 746.

A transistor 843 illustrated in FIG. 19(A2) is different from the transistor 842 in that the electrode 723 is included. The transistor 843 includes the electrode 723 that is formed over the substrate 771. The electrode 723 has a region overlapping with the semiconductor layer 742 with the insulating layer 772 therebetween. The electrode 723 can function as a back gate electrode.

As in a transistor 844 illustrated in FIG. 19(B1) and a transistor 845 illustrated in FIG. 19(B2), the insulating layer 726 in a region that does not overlap with the electrode 746 may be completely removed. Alternatively, as in a transistor 846 illustrated in FIG. 19(C1) and a transistor 847 illustrated in FIG. 19(C2), the insulating layer 726 may be left.

Also in the transistor 843 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. One embodiment of the present invention can achieve a display device which includes transistors with a high integration degree and excellent electrical characteristics.

This embodiment can be implemented in appropriate combination with any of the structures described in the other embodiments and the like.

Embodiment 6

In this embodiment, a semiconductor device that can be used for the display device described as examples in the above embodiment will be described. The semiconductor device described below as an example can function as a memory device.

In this embodiment, a DOSRAM (registered trademark) will be described as an example of a memory device using an oxide semiconductor. The name "DOSRAM" stands for a dynamic oxide semiconductor random access memory. A DOSRAM refers to a memory device including a 1T1C (one transistor and one capacitor) memory cell where a writing transistor is formed using an oxide semiconductor.

A layered structure example of a DOSRAM 1000 will be described with reference to FIG. 20. In the DOSRAM 1000, a sense amplifier portion 1002 that performs data reading and a cell array portion 1003 that stores data are stacked.

Figure 20:
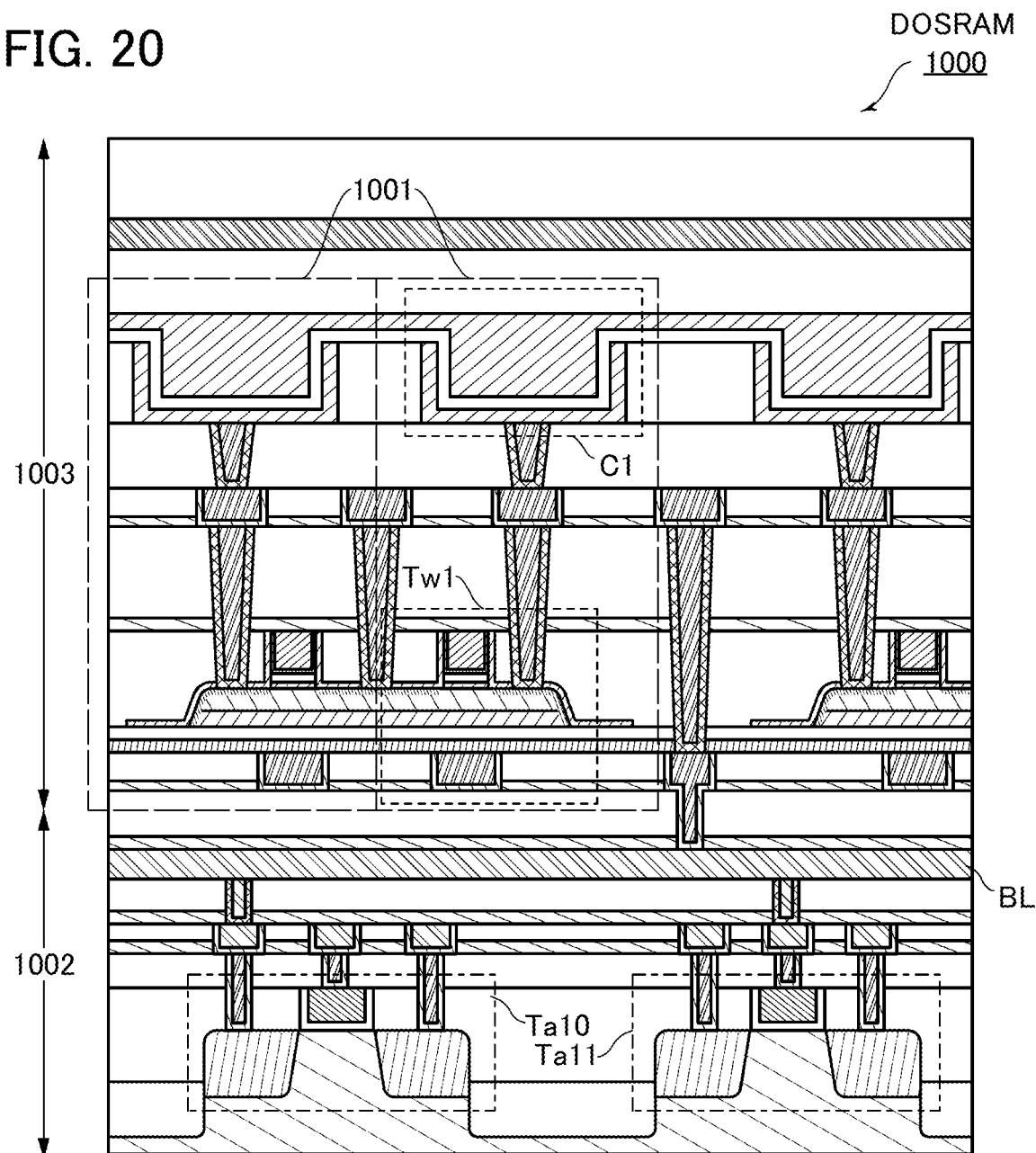
FIG. 20 A cross-sectional view showing a structure example of a DOSRAM.

As illustrated in FIG. 20, the sense amplifier portion 1002 includes a bit line BL and Si transistors Ta10 and Ta11. The Si transistors Ta10 and Ta11 include a semiconductor layer in a single crystal silicon wafer. The Si transistors Ta10 and Ta11 are included in the sense amplifier and electrically connected to the bit line BL.

The cell array portion 1003 includes a plurality of memory cells 1001. The memory cell 1001 includes a transistor Tw1 and a capacitor C1. In the cell array portion 1003, two transistors Tw1 share a semiconductor layer. The semiconductor layer and the bit line BL are electrically connected to each other through a conductor that is not illustrated.

The layered structure illustrated in FIG. 20 can be used for a variety of semiconductor devices formed by stacking a plurality of circuits each including a transistor group.

Metal oxides, insulators, conductors, and the like in FIG. 20 have either a single-layer structure or a layered structure. They can be formed by any of a variety of deposition methods such as a sputtering method, a molecular beam epitaxy (MBE) method, a pulsed laser ablation (PLA) method, a CVD method, and an atomic layer deposition (ALD) method. Examples of the CVD method include a plasma CVD method, a thermal CVD method, and a metal organic CVD method.

Here, the semiconductor layer of the transistor Tw1 is formed using a metal oxide (oxide semiconductor). An example is illustrated in which the semiconductor layer is formed of three metal oxide layers. The semiconductor layer is preferably formed using a metal oxide containing In, Ga, and Zn.

When an element that forms oxygen vacancies or an element that is bonded to oxygen vacancies is added to the metal oxide, the metal oxide may have increased carrier density and thus have reduced resistance. For example, the resistance of the semiconductor layer formed using the metal oxide is selectively reduced, whereby a source region or a drain region can be provided in the semiconductor layer.

As the element that reduces the resistance of the metal oxide, boron or phosphorus is typically used. Hydrogen, carbon, nitrogen, fluorine, sulfur, chlorine, titanium, a rare gas, or the like can also be used. Typical examples of the rare gas include helium, neon, argon, krypton, and xenon. The concentration of the element can be measured by secondary ion mass spectrometry (SIMS) or the like.

In particular, boron and phosphorus are preferably used because an apparatus used in a manufacturing line for amorphous silicon or low-temperature polysilicon can be used. Since the existing facility can be used, capital investment can be reduced.

The transistor including the semiconductor layer having selectively reduced resistance can be formed using a dummy gate, for example. Specifically, the dummy gate is provided over the semiconductor layer, and an element that reduces the resistance of the semiconductor layer is preferably added to the semiconductor layer using the dummy gate as a mask. That is, the element is added to a region of the semiconductor layer that does not overlap with the dummy gate, so that a low-resistance region is formed. For the addition of the element, an ion implantation method by which an ionized source gas is subjected to mass separation and then added, an ion doping method by which an ionized source gas is added without mass separation, a plasma immersion ion implantation method, or the like can be used.

Examples of a conductive material used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

Examples of an insulating material used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound that contains more oxygen than nitrogen, and a nitride oxide refers to a compound that contains more nitrogen than oxygen.

This embodiment can be implemented in appropriate combination with any of the structures described in the other embodiments and the like.

Embodiment 7

Examples of an electronic device that can use the display device in one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 21 illustrates specific examples of these electronic devices.

FIG. 21(A) illustrates a television, which includes a housing 971, a display portion 973, an operation key 974, speakers 975, a communication connection terminal 976, an optical sensor 977, and the like. The display portion 973 includes a touch sensor that also enables input operation. With the use of the display device of one embodiment of the present invention for the display portion 973, the arithmetic throughput for displaying superimposed images on the display portion 973 can be reduced. Alternatively, with the use of the display device of one embodiment of the present invention for the display portion 973, display can be performed with the number of gray-scale levels which is greater than or equal to the number of bits that can be output from the source driver.

FIG. 21(B) illustrates an information processing terminal, which includes a housing 901, a display portion 902, a display portion 903, a sensor 904, and the like. The display portion 902 and the display portion 903 are formed using one display panel and have flexibility. The housing 901 also has flexibility, can be used while being bent as illustrated in the drawing, and can be used in a flat plate-like shape like a tablet terminal. The sensor 904 can sense the shape of the housing 901, and for example, it is possible to switch display on the display portion 902 and the display portion 903 when the housing is bent. With the use of the display device of one embodiment of the present invention for the display portion 902 and the display portion 903, the arithmetic throughput for displaying superimposed images on the display portion 902 and the display portion 903 can be reduced. Alternatively, with the use of the display device of one embodiment of the present invention for the display portion 902 and the display portion 903, display can be performed with the number of gray-scale levels which is greater than or equal to the number of bits that can be output from the source driver.

FIG. 21(C) illustrates a digital camera, which includes a housing 961, a shutter button 962, a microphone 963, a speaker 967, a display portion 965, operation keys 966, a zoom lever 968, a lens 969, and the like. With the use of the display device of one embodiment of the present invention for the display portion 965, the arithmetic throughput for displaying superimposed images on the display portion 965 can be reduced.

FIG. 21(D) illustrates a digital signage, which has large display portions 922 attached on the side surfaces of a pillar 921. With the use of the display device of one embodiment of the present invention for the display portion 922, the arithmetic throughput for displaying superimposed images on the display portion 922 can be reduced. Alternatively, with the use of the display device of one embodiment of the present invention for the display portion 922, display can be performed with the number of gray-scale levels which is greater than or equal to the number of bits that can be output from the source driver.

FIG. 21(E) illustrates an example of a cellular phone, which includes a housing 951, a display portion 952, an operation button 953, an external connection port 954, a speaker 955, a microphone 956, a camera 957, and the like. The display portion 952 of the cellular phone includes a touch sensor. A variety of operations such as making a call and inputting text can be performed by touch on the display portion 952 with a finger, a stylus, or the like. The housing 951 and the display portion 952 have flexibility and can be used while being bent as illustrated in the drawing. With the use of the display device of one embodiment of the present invention for the display portion 952, the arithmetic throughput for displaying superimposed images on the display portion 952 can be reduced. Alternatively, with the use of the display device of one embodiment of the present invention for the display portion 952, display can be performed with the number of gray-scale levels which is greater than or equal to the number of bits that can be output from the source driver.

FIG. 21(F) illustrates a portable data terminal, which includes a housing 911, a display portion 912, speakers 913, a camera 919, and the like. A touch panel function of the display portion 912 enables input and output of information. With the use of the display device of one embodiment of the present invention for the display portion 912, the arithmetic throughput for displaying superimposed images on the display portion 912 can be reduced. Alternatively, with the use of the display device of one embodiment of the present invention for the display portion 912, display can be performed with the number of gray-scale levels which is greater than or equal to the number of bits that can be output from the source driver.

This embodiment can be implemented in appropriate combination with any of the structures described in the other embodiments and the like.

Example

In this example, whether an output obtained by addition of the signals W1 and W2 and the signals data1 and data2 in the pixel circuit with the configuration illustrated in FIG. 10 has a desired gray scale level was examined using a circuit simulation.

Parameters used for the circuit simulation were as described below, and the transistor size of the transistor M2 was L (channel length)/W (channel width)=9 μm/6 μm and the transistor sizes of the transistors other than the transistor M2 were each L/W=4 μm/4 The capacitances of the capacitors C1 and C2 were each 100 fF, and the capacitance of the capacitor C3 was 30 fF. The light-emitting element OLED was an FN diode model, the anode potential and the reference voltage Vref of the wiring ANO were +10 V and 0 V, respectively, and the cathode potential of the wiring CAT was changed in 1 V steps in the range of −9 V to −5 V. The minimum value and the maximum value of each of the signal W1, the signal W2, the signal data1, and the signal data2 were 0 V and +5 V, respectively. Note that SPICE was used as circuit simulation software.

Figure 22A:
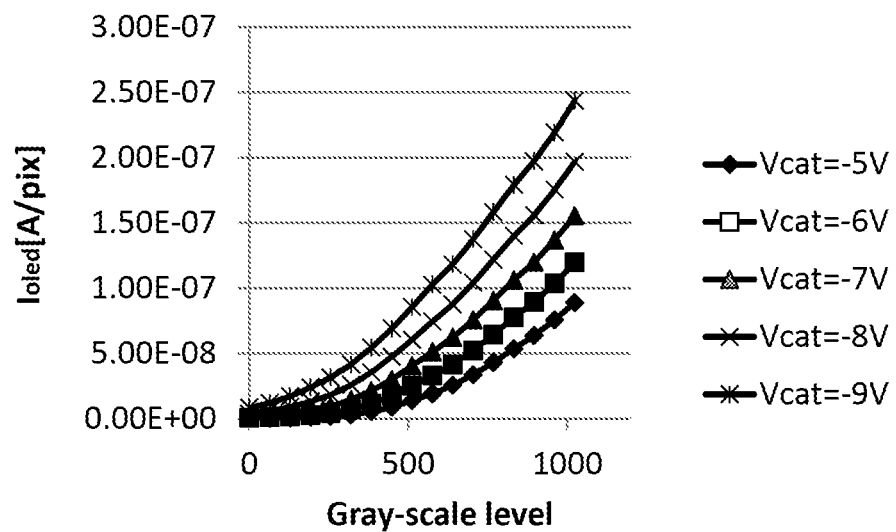
FIGS. 22A and 22B Graphs showing operation examples of a display device.

FIG. 22(A) is a graph estimating how the amount of current flowing through the light-emitting element in a pixel changes with respect to the gray scale level (corresponding to 10 bits of 0 to 1024) that can be expressed by changes of the signal W1, the signal W2, the signal data1, and the signal data2 and addition of a plurality of signals. In addition, in FIG. 22(A), the amount of current (Ioled) flowing through the light-emitting element in a pixel when the voltage of the wiring CAT was changed in 1 V steps in the range of −9 V to −5 V and the signal W1, the signal W2, the signal data1, and the signal data2 were changed was estimated.

Figure 22B:
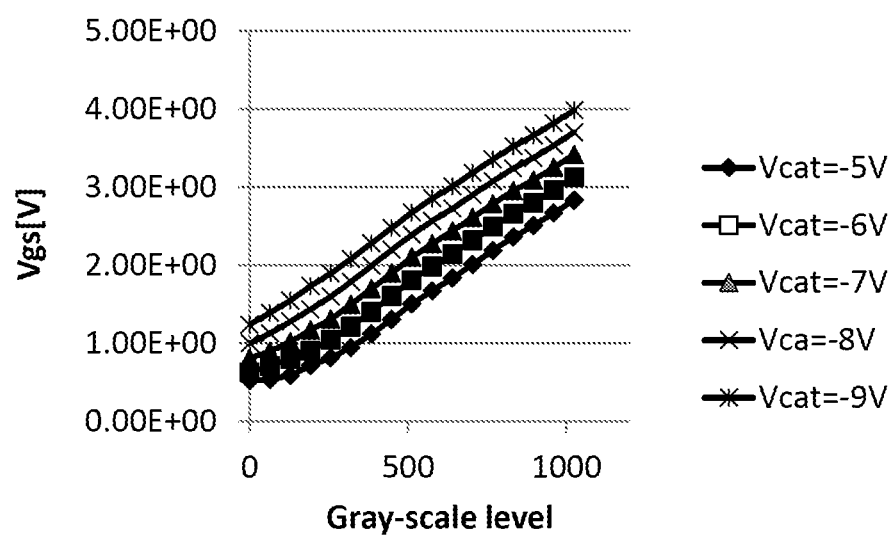

Similarly, FIG. 22(B) is a graph estimating how the gate-source voltage (Vgs) of the transistor M2 which changes by addition of a plurality of written signals changes with respect to the gray scale level (corresponding to 10 bits of 0 to 1024) that can be expressed by changes of the signal W1, the signal W2, the signal data1, and the signal data2 and addition of the plurality of signals. In addition, in FIG. 22(B), as in FIG. 22(A), the gate-source voltage of the transistor M2 when the voltage of the wiring CAT was changed in 1 V steps in the range of −9 V to −5 V and the signal W1, the signal W2, the signal data1, and the signal data2 were changed was estimated.

It was found from the graphs shown in FIGS. 22(A) and 22(B) that the pixel illustrated in FIG. 10 was able to perform favorable gray-scale display by being operated by the driving methods described in FIG. 11 and FIG. 12.

REFERENCE NUMERALS

100: display device, 110: display portion, 111: pixel, 112: memory circuit, 113: memory circuit, 114: transistor, 115: capacitor, 116: capacitor, 117: transistor, 118: transistor, 119: capacitor, 120: transistor, 121: transistor, 122: transistor, 123: light-emitting element, 124: wiring, 130: gate driver, 140: data driver

The invention claimed is:

1. A display device comprising a pixel, the pixel comprising a first memory circuit, a second memory circuit, a first transistor, a third capacitor, and a display element,
   wherein the first memory circuit comprises a second transistor, a third transistor, and a first capacitor,
   wherein the second memory circuit comprises the second transistor, a fourth transistor, and a second capacitor,
   wherein one electrode of the first capacitor is electrically connected to a first wiring through the second transistor,
   wherein the other electrode of the first capacitor is electrically connected to a second wiring through the third transistor,
   wherein one electrode of the second capacitor is electrically connected to the first wiring through the second transistor,
   wherein the other electrode of the second capacitor is electrically connected to a third wiring through the fourth transistor,
   wherein the one electrode of the first capacitor, the one electrode of the second capacitor, and one electrode of the third capacitor are electrically connected to a gate of the first transistor, and
   wherein the other electrode of the third capacitor is electrically connected to one of a source and a drain of the first transistor, and to the display element.

2. The display device according to claim 1,
   wherein the second transistor to the fourth transistor each comprise a metal oxide in a channel formation region, and the metal oxide comprises In, Zn, and M, and
   wherein M is Al, Ti, Ga, Sn, Y, Zr, La, Ce, Nd, or Hf.

3. The display device according to claim 1, wherein the display element is an EL element.

4. An electronic device comprising the display device according to claim 1, and a camera.

* * * * *